(12) United States Patent
Madigan et al.

(10) Patent No.: US 10,262,881 B2
(45) Date of Patent: Apr. 16, 2019

(54) ENVIRONMENTALLY CONTROLLED COATING SYSTEMS

(71) Applicant: Kateeva, Inc., Newark, CA (US)

(72) Inventors: Conor F. Madigan, San Francisco, CA (US); Alexander Sou-Kang Ko, Santa Clara, CA (US); Eliyahu Vronsky, Los Altos, CA (US)

(73) Assignee: Kateeva, Inc., Newark, CA (US)

( * ) Notice: Subject to any disclaimer, the term of this patent is extended or adjusted under 35 U.S.C. 154(b) by 0 days.

(21) Appl. No.: 15/485,928

(22) Filed: Apr. 12, 2017

(65) Prior Publication Data

US 2017/0221729 A1    Aug. 3, 2017

Related U.S. Application Data

(63) Continuation of application No. PCT/US2015/062777, filed on Nov. 25, 2015.
(Continued)

(51) Int. Cl.
*H01L 51/00* (2006.01)
*H01L 21/67* (2006.01)
(Continued)

(52) U.S. Cl.
CPC ........ *H01L 21/6715* (2013.01); *B05C 5/0254* (2013.01); *B05D 3/0486* (2013.01);
(Continued)

(58) Field of Classification Search
CPC ............. H01L 21/6715; H01L 21/6719; H01L 21/67389; H01L 21/6776; H01L 51/0003
See application file for complete search history.

(56) References Cited

U.S. PATENT DOCUMENTS

| 3,216,858 A | 11/1965 | Bogdanowski |
| 3,498,343 A | 3/1970 | Sperberg |

(Continued)

FOREIGN PATENT DOCUMENTS

| CN | 1445089 A | 10/2003 |
| CN | 1956209 A | 5/2007 |

(Continued)

OTHER PUBLICATIONS

Non-Final Office Action dated Jul. 1, 2014, to U.S. Appl. No. 13/773,654.
(Continued)

*Primary Examiner* — Scott B Geyer
(74) *Attorney, Agent, or Firm* — Paula J. Tostado

(57) ABSTRACT

Embodiments of an enclosed coating system according to the present teachings can be useful for patterned area coating of substrates in the manufacture of a variety of apparatuses and devices in a wide range of technology areas, for example, but not limited by, OLED displays, OLED lighting, organic photovoltaics, Perovskite solar cells, and organic semiconductor circuits. Enclosed and environmentally controlled coating systems of the present teachings can provide several advantages, such as: 1) Elimination of a range of vacuum processing operations such coating-based fabrication can be performed at atmospheric pressure. 2) Controlled patterned coating eliminates material waste, as well as eliminating additional processing typically required to achieve patterning of an organic layer. 3) Various formulations used for patterned coating with various embodiments of an enclosed coating apparatus of the present teachings can have a wide range of physical properties, such as viscosity and surface tension. Various embodiments of an enclosed coating system can be integrated with various components that provide a gas circulation and filtration system, a particle
(Continued)

control system, a gas purification system, and a thermal regulation system and the like to form various embodiments of an enclosed coating system that can sustain an inert gas environment that is substantially low-particle for various coating processes of the present teachings that require such an environment.

12 Claims, 9 Drawing Sheets

Related U.S. Application Data

(60) Provisional application No. 62/085,211, filed on Nov. 26, 2014.

(51) Int. Cl.
| | | |
|---|---|---|
| *H01L 21/677* | (2006.01) | |
| *H01L 21/673* | (2006.01) | |
| *B05D 3/04* | (2006.01) | |
| *B05C 5/02* | (2006.01) | |
| *H01L 51/56* | (2006.01) | |

(52) U.S. Cl.
CPC ...... *H01L 21/6719* (2013.01); *H01L 21/6776* (2013.01); *H01L 21/67098* (2013.01); *H01L 21/67389* (2013.01); *H01L 21/67784* (2013.01); *H01L 51/0003* (2013.01); *H01L 51/56* (2013.01); *Y02E 10/549* (2013.01)

(56) References Cited

U.S. PATENT DOCUMENTS

| | | | |
|---|---|---|---|
| 3,670,466 A | 6/1972 | Lynch | |
| 3,885,362 A | 5/1975 | Pollock | |
| 4,226,897 A | 10/1980 | Coleman | |
| 4,581,478 A | 4/1986 | Pugh et al. | |
| 4,676,144 A | 6/1987 | Smith | |
| 4,693,175 A | 9/1987 | Hashimoto | |
| 4,721,121 A | 1/1988 | Adams | |
| 5,029,518 A | 7/1991 | Austin | |
| 5,065,169 A | 11/1991 | Vincent et al. | |
| 5,314,377 A | 5/1994 | Pelosi | |
| 5,344,365 A | 9/1994 | Scott et al. | |
| 5,562,539 A | 10/1996 | Hashimoto et al. | |
| 5,651,625 A | 7/1997 | Smith et al. | |
| 5,896,154 A | 4/1999 | Mitani et al. | |
| 6,023,899 A | 2/2000 | Mecozzi | |
| 6,049,167 A | 4/2000 | Onitsuka et al. | |
| 6,089,282 A | 7/2000 | Spiegelman et al. | |
| 6,375,304 B1 | 4/2002 | Aldrich et al. | |
| 6,437,351 B1 | 8/2002 | Smick et al. | |
| 6,604,810 B1 | 8/2003 | Silverbrook | |
| 6,781,684 B1 | 8/2004 | Ekhoff | |
| 6,869,636 B2 | 3/2005 | Chung | |
| 7,100,302 B2 | 9/2006 | Kolb et al. | |
| 7,258,768 B2 | 8/2007 | Yamazaki | |
| 7,326,300 B2 | 2/2008 | Sun et al. | |
| 7,384,662 B2 | 6/2008 | Takano et al. | |
| 7,387,662 B2 | 6/2008 | Ahman et al. | |
| 7,530,778 B2 | 5/2009 | Yassour et al. | |
| 7,703,911 B2 | 4/2010 | Chung et al. | |
| 7,989,025 B2 | 8/2011 | Sakai et al. | |
| 8,383,202 B2 | 2/2013 | Somekh et al. | |
| 8,414,688 B1 | 4/2013 | Delgado et al. | |
| 8,720,366 B2 | 5/2014 | Somekh et al. | |
| 8,771,793 B2 | 7/2014 | Wilsey et al. | |
| 8,802,186 B2 | 8/2014 | Somekh et al. | |
| 8,802,195 B2 | 8/2014 | Somekh et al. | |
| 8,875,648 B2 | 11/2014 | Somekh et al. | |
| 8,899,171 B2 | 12/2014 | Mauck et al. | |
| 9,048,344 B2 | 6/2015 | Mauck et al. | |
| 9,174,433 B2 | 11/2015 | Somekh et al. | |
| 9,248,643 B2 | 2/2016 | Somekh et al. | |
| 9,278,564 B2 | 3/2016 | Mauck et al. | |
| 9,387,709 B2 | 7/2016 | Mauck et al. | |
| 2001/0041530 A1 | 11/2001 | Hara | |
| 2002/0033860 A1 | 3/2002 | Kubota et al. | |
| 2002/0079057 A1 | 6/2002 | Yoshioka et al. | |
| 2002/0084464 A1 | 7/2002 | Yamazaki et al. | |
| 2002/0124906 A1 | 9/2002 | Suzuki et al. | |
| 2002/0191063 A1 | 12/2002 | Gelbart et al. | |
| 2003/0000476 A1 | 1/2003 | Matsunaga et al. | |
| 2003/0097929 A1 | 5/2003 | Watanabe et al. | |
| 2003/0175414 A1 | 9/2003 | Hayashi | |
| 2004/0050325 A1 | 3/2004 | Samoilov et al. | |
| 2004/0062856 A1 | 4/2004 | Marcus et al. | |
| 2004/0086631 A1 | 5/2004 | Han et al. | |
| 2004/0115339 A1 | 6/2004 | Ito | |
| 2004/0118309 A1 | 6/2004 | Fedor et al. | |
| 2004/0123804 A1 | 7/2004 | Yamazaki et al. | |
| 2005/0005850 A1 | 1/2005 | Yamazaki | |
| 2005/0040338 A1 | 2/2005 | Weiss et al. | |
| 2005/0062773 A1 | 3/2005 | Fouet | |
| 2005/0140764 A1 | 6/2005 | Chang et al. | |
| 2005/0223994 A1 | 10/2005 | Blomiley et al. | |
| 2006/0045669 A1 | 3/2006 | Namioka et al. | |
| 2006/0054774 A1 | 3/2006 | Yassour et al. | |
| 2006/0096395 A1 | 5/2006 | Weiss et al. | |
| 2006/0099328 A1 | 5/2006 | Waite et al. | |
| 2006/0119669 A1 | 6/2006 | Sharma et al. | |
| 2006/0219605 A1 | 10/2006 | Devitt | |
| 2006/0236938 A1 | 10/2006 | Powell et al. | |
| 2006/0273713 A1 | 12/2006 | Mehta et al. | |
| 2007/0021050 A1 | 1/2007 | Kennedy | |
| 2007/0026151 A1 | 2/2007 | Higginson et al. | |
| 2007/0044713 A1 | 3/2007 | Yasui et al. | |
| 2007/0046185 A1 | 3/2007 | Kim | |
| 2007/0128368 A1* | 6/2007 | Minamino | B05D 7/04 427/377 |
| 2007/0234952 A1 | 10/2007 | Kojima | |
| 2007/0257033 A1 | 11/2007 | Yamada | |
| 2008/0085652 A1 | 4/2008 | Winters | |
| 2008/0206036 A1 | 8/2008 | Smith et al. | |
| 2008/0241587 A1 | 10/2008 | Ohmi et al. | |
| 2008/0259101 A1 | 10/2008 | Kurita et al. | |
| 2008/0260938 A1 | 10/2008 | Ikeda et al. | |
| 2008/0308037 A1 | 12/2008 | Bulovic et al. | |
| 2008/0311307 A1 | 12/2008 | Bulovic et al. | |
| 2009/0031579 A1 | 2/2009 | Piatt et al. | |
| 2009/0058915 A1 | 3/2009 | Hayashi et al. | |
| 2009/0078204 A1 | 3/2009 | Kerr et al. | |
| 2009/0081885 A1 | 3/2009 | Levy et al. | |
| 2009/0165854 A1* | 7/2009 | Yamazaki | H01L 21/76254 136/258 |
| 2010/0201749 A1 | 8/2010 | Somekh et al. | |
| 2011/0043554 A1 | 2/2011 | Silverbrook et al. | |
| 2011/0086164 A1 | 4/2011 | Lang et al. | |
| 2011/0096124 A1 | 4/2011 | North et al. | |
| 2011/0318503 A1 | 12/2011 | Adams et al. | |
| 2012/0032157 A1 | 2/2012 | Kawabe et al. | |
| 2012/0056923 A1 | 3/2012 | Vronsky et al. | |
| 2012/0156365 A1 | 6/2012 | Ohara | |
| 2012/0201749 A1 | 8/2012 | Crawshaw et al. | |
| 2012/0306951 A1 | 12/2012 | Somekh et al. | |
| 2013/0004656 A1 | 1/2013 | Chen et al. | |
| 2013/0038649 A1 | 2/2013 | Lowrance et al. | |
| 2013/0040061 A1 | 2/2013 | Lowrance et al. | |
| 2013/0096124 A1 | 4/2013 | Nanchen et al. | |
| 2013/0149502 A1 | 6/2013 | Dudley et al. | |
| 2013/0164438 A1 | 6/2013 | Somekh et al. | |
| 2013/0164439 A1 | 6/2013 | Somekh et al. | |
| 2013/0206058 A1 | 8/2013 | Mauck et al. | |
| 2013/0209669 A1 | 8/2013 | Somekh et al. | |
| 2013/0209670 A1 | 8/2013 | Somekh et al. | |
| 2013/0209671 A1 | 8/2013 | Somekh et al. | |
| 2013/0252533 A1 | 9/2013 | Mauck et al. | |
| 2013/0307898 A1 | 11/2013 | Somekh et al. | |
| 2014/0233843 A1* | 8/2014 | Cocca | G06T 7/0004 382/145 |
| 2014/0311405 A1 | 10/2014 | Mauck et al. | |
| 2016/0207313 A1 | 7/2016 | Somekh et al. | |

(56) References Cited

U.S. PATENT DOCUMENTS

| | | | | |
|---|---|---|---|---|
| 2017/0004983 | A1* | 1/2017 | Madigan | ............ H01L 51/0005 |
| 2017/0080730 | A1 | 3/2017 | Mauck et al. | |
| 2017/0130315 | A1 | 5/2017 | Somekh et al. | |
| 2017/0239966 | A1 | 8/2017 | Mauck et al. | |
| 2017/0321911 | A1 | 11/2017 | Mauck et al. | |

FOREIGN PATENT DOCUMENTS

| | | | |
|---|---|---|---|
| CN | 101088141 | A | 12/2007 |
| CN | 101243543 | A | 8/2008 |
| CN | 101357541 | A | 2/2009 |
| CN | 201446232 | U | 5/2010 |
| CN | 101754861 | A | 6/2010 |
| EP | 2973676 | A2 | 1/2016 |
| JP | 62098783 | | 6/1987 |
| JP | 2005502487 | A | 4/1993 |
| JP | H11312640 | A | 11/1999 |
| JP | 2002093878 | A | 3/2000 |
| JP | 2003173871 | A | 6/2003 |
| JP | 2003272847 | A | 9/2003 |
| JP | 2004146369 | A | 5/2004 |
| JP | 2004164873 | A | 6/2004 |
| JP | 2004253332 | A | 9/2004 |
| JP | 2004291456 | A | 10/2004 |
| JP | 2004362854 | A | 12/2004 |
| JP | 2004535956 | A | 12/2004 |
| JP | 2005074299 | A | 3/2005 |
| JP | 2007013140 | A | 1/2007 |
| JP | 2007299785 | A | 11/2007 |
| JP | 2008047340 | A | 2/2008 |
| JP | 2008511146 | A | 4/2008 |
| JP | 2009112889 | A | 5/2009 |
| JP | 2010134315 | A | 6/2010 |
| JP | 2010533057 | A | 10/2010 |
| JP | 2011056360 | A | 3/2011 |
| JP | 2011225355 | A | 11/2011 |
| JP | 2011255366 | A | 12/2011 |
| JP | 2015510254 | A | 4/2015 |
| KR | 20060044265 | A | 5/2006 |
| KR | 20070042272 | A | 4/2007 |
| TW | 200302678 | A | 8/2003 |
| TW | 200303829 | A | 9/2003 |
| TW | I247554 | | 1/2006 |
| TW | 200618308 | A | 6/2006 |
| WO | 2001060623 | A1 | 8/2001 |
| WO | 2006021568 | A1 | 3/2006 |
| WO | 2011118652 | A1 | 9/2011 |
| WO | 2012172919 | A1 | 12/2012 |
| WO | 2014164932 | A3 | 2/2015 |

OTHER PUBLICATIONS

Notice of Allowance dated Jan. 31, 2017 for U.S. Appl. No. 14/205,340.
Notice of Allowance dated Dec. 7, 2012 to U.S. Appl. No. 12/652,040.
Notice of Allowance dated Dec. 9, 2014 for U.S. Appl. No. 13/802,304.
Notice of Allowance dated Feb. 20, 2014, to U.S. Appl. No. 13/551,209.
Notice of Allowance dated Jul. 1, 2014, to U.S. Appl. No. 13/773,649.
Notice of Allowance dated Jul. 17, 2015 for U.S. Appl. No. 13/570,154.
Notice of Allowance dated Jul. 2, 2014, to U.S. Appl. No. 13/774,577.
Notice of Allowance dated Jun. 30, 2014, to U.S. Appl. No. 13/773,643.
Notice of Allowance dated Mar. 29, 2017, to U.S. Appl. No. 15/423,169.
Notice of Allowance dated May 16, 2016 to U.S. Appl. No. 14/637,301.
Notice of Allowance dated May 18, 2017 for U.S. Appl. No. 14/543,786.
Notice of Allowance dated Nov. 19, 2015, to U.S. Appl. No. 13/776,602.
Notice of Allowance dated Oct. 6, 2014 for U.S. Appl. No. 13/720,830.
Notice of Allowance dated Sep. 9, 2015, to U.S. Appl. No. 13/774,693.
Notice of Allowance dated Sep. 29, 2014, to U.S. Appl. No. 13/773,654.
Second Notice of Allowance dated Feb. 10, 2017 for U.S. Appl. No. 14/205,340.
Applicant-Initiated Interview Summary dated Sep. 22, 2017, for U.S. Appl. No. 14/543,786.
CN First Office Action dated Aug. 1, 2017 for CN Patent Application No. 201610692510.9.
CN Second Office Action dated Jul. 31, 2017 for CN Patent Application No. 20140027671.5.
Non-Final Office action dated Sep. 18, 2017, to U.S. Appl. No. 14/543,786.
Applicant Initiated Interview Summary dated Aug. 15, 2013, to U.S. Appl. No. 13/551,209.
Applicant-Initiated Interview Summary dated Aug. 20, 2014 for U.S. Appl. No. 13/802,304.
Applicant-Initiated Interview Summary dated Jun. 30, 2014 for U.S. Appl. No. 13/720,830.
Applicant-Initiated Interview Summary dated Oct. 19, 2012 for U.S. Appl. No. 12/652,040.
Applicant-Initiated Interview Summary dated Apr. 7, 2017 for U.S. Appl. No. 14/275,637.
Applicant-Initiated Interview Summary dated Dec. 22, 2016 to U.S. Appl. No. 14/543,786.
Corrected Notice of Allowability dated Feb. 3, 2015 for U.S. Appl. No. 13/802,304.
Corrected Notice of Allowability dated Oct. 31, 2014 for U.S. Appl. No. 13/720,830.
Examiner Initiated Interview Summary dated Jun. 30, 2016 for U.S. Appl. No. 14/543,786.
Final Office Action dated Oct. 14, 2016 for U.S. Appl. No. 14/205,340.
Final Office Action dated Jun. 10, 2014, to U.S. Appl. No. 13/773,649.
Final Office Action dated Jun. 12, 2014, to U.S. Appl. No. 13/773,643.
Final Office Action dated Jun. 18, 2014, to U.S. Appl. No. 13/774,577.
Final Office Action dated Nov. 8, 2013, to U.S. Appl. No. 13/551,209.
Final Office Action dated Oct. 7, 2016 for U.S. Appl. No. 14/275,637.
International Search Report and Written Opinion dated Dec. 22, 2014, to PCT Application PCT/US14/023820.
International Search Report and Written Opinion dated Feb. 12, 2016 for International Patent Application No. PCT/US2015/062777.
International Search Report and Written Opinion dated Feb. 26, 2013 for PCT Application No. PCT/US12/70717.
International Search Report and Written Opinion dated Jun. 18, 2013 for PCT Application No. PCT/US13/031083.
International Search Report and Written Opinion dated Mar. 11, 2014, to PCT Application PCT/US13/063128.
International Search Report and Written Opinion dated Oct. 8, 2014, for corresponding PCT Application No. PCT/US2014/037722.
Non-Final Office Action dated Apr. 15, 2015 to U.S. Appl. No. 13/776,602.
Non-Final Office Action dated Apr. 17, 2015, to U.S. Appl. No. 13/774,693.
Non-Final Office Action dated Apr. 24, 2013, to U.S. Appl. No. 13/551,209.
Non-Final Office Action dated Apr. 27, 2016, to U.S. Appl. No. 14/543,786.
Non-Final Office Action dated Apr. 28, 2014, to U.S. Appl. No. 13/720,830.
Non-Final Office Action dated Apr. 4, 2016, to U.S. Appl. No. 14/205,340.
Non-Final Office Action dated Dec. 31, 2013, to U.S. Appl. No. 13/774,577.
Non-Final Office Action dated Feb. 17, 2017 for U.S. Appl. No. 15/409,844.
Non-Final Office Action dated Feb. 28, 2014, to U.S. Appl. No. 13/773,649.
Non-Final Office Action dated Feb. 7, 2014, to U.S. Appl. No. 13/773,643.
Non-Final Office Action dated Jan. 17, 2017 for U.S. Appl. No. 14/996,086.

(56) References Cited

OTHER PUBLICATIONS

Non-Final Office Action dated Jun. 14, 2012, to U.S. Appl. No. 12/652,040.
Non-Final Office Action dated Mar. 10, 2016 to U.S. Appl. No. 14/275,637.
Non-Final Office Action dated May 16, 2014, to U.S. Appl. No. 13/802,304.
Non-Final Office Action dated Nov. 20, 2015 for U.S. Appl. No. 14/637,301.
Non-Final Office Action dated Nov. 4, 2016 for U.S. Appl. No. 14/543,786.
Extended European Search Report dated Jun. 19, 2017 for EP Patent Application No. 14779907.6.
Final Office Action dated Jul. 19, 2017 for U.S. Appl. No. 15/409,844.
Final Office Action dated Jul. 28, 2017 for U.S. Appl. No. 14/996,086.
JP Office Action dated Jun. 1, 2017, to JP Patent Application No. 2016-501353.
KR Notification of Provisional Rejection dated May 25, 2017 for KR Patent Application No. 10-2014-7020478.
Supplemental Notice of Allowability dated Jun. 7, 2017 for U.S. Appl. No. 14/543,786.
TW Examination Report issued to TW Patent Application 105117833, dated May 10, 2017.
Second CN Office Action dated Jul. 31, 2017 for CN Patent Application No. 20140027671.5.
CN Office Action dated Jan. 23, 2017 for CN Patent Application No. 201480027671.5.
CN Office Action dated Mar. 27, 2017 for CN Patent Application No. 201610181336.1.
CN Second Office Action dated Mar. 24, 2017 for CN Patent Application No. 201480045349.5.
CN Third Office Action dated Jul. 12, 2017 for CN Patent Application No. 201480045349.5.
EP Extended Search Report dated Mar. 9, 2018, to EP Patent Application No. 18155378.5.
Examination Report dated Apr. 12, 2017 for EP Patent Application No. 13858304.2.
Examination Report dated Apr. 19, 2017 for TW Patent Application No. 103108995.
Examination Report dated Apr. 26, 2016, to TW Patent Application 101148932.
Examination Report dated Oct. 8, 2015, to TW Patent Application No. 102143142.
Examination Report dated Mar. 22, 2018, to TW Patent Application No. 103117122.
Examiner-Initiated Interview Summary dated Apr. 5, 2018, to U.S. Appl. No. 14/275,637.
Extended European Search Report dated Jul. 1, 2016 for EP Application No. 13585304.2.
Extended European Search Report dated Apr. 12, 2017 for EP Patent Application No. 14810543.0.
Final Office Action dated Mar. 7, 2018, to U.S. Appl. No. 14/543,786.
Forrest, Stephen R., "The Path to Ubiquitous and Low-cost Organic Electronic Appliances on Plastic," Nature, Apr. 29, 2004, vol. 428, 8 pages.
Fourth Office Action dated Mar. 25, 2016 for CN Application No. 201210596572.1.
Japanese Official Action dated Jul. 28, 2016 for Japanese Patent Application No. 2014-548852.
JP Office Action dated Apr. 26, 2017 for JP Patent Application No. 2016-90252.
Non-Final Office Action dated Feb. 13, 2018 for U.S. Appl. No. 14/996,086.
Non-Final Office action dated Jan. 26, 2018, to U.S. Appl. No. 15/184,755.
Notice of Allowance dated Nov. 2, 2017, to U.S. Appl. No. 15/409,844.
Notification of Provisional Rejection dated Dec. 9, 2015, for Korean Patent Application No. 10-2015-7014277.
Notification of Provisional Rejection dated Jun. 14, 2016 for KR Application No. 10-2016-7014087.
Office action dated Feb. 2, 2018, to JP Patent Application No. 2016-519508.
Office Action dated Jun. 22, 2016 to CN Patent Application No. 201480045349.5.
Office Action issued to CN Patent Application 201210595672 dated Mar. 23, 2015.
Office Action Issued to CN Patent Application 201310704315.X dated Aug. 13, 2015.
Office Action issued to Japanese Patent Application No. 2015-544055, dated Oct. 26, 2015.
Penultimate Office action dated Mar. 22, 2018, to JP Patent Application No. 2016-90252.
Provisional Rejection dated Mar. 14, 2018, to KR Patent Application No. 10-2018-7003619.
Provisional Rejection dated Oct. 17, 2017, to KR Patent Application No. 10-2015-7027963.
Search Report dated Jul. 29, 2015 to CN Patent Application 201310704315.X.
Second CN Office Action dated Sep. 27, 2017 for CN Patent Application No. 201610181336.1.
Second Office Action issued to CN Patent Application 201210596572 dated Oct. 8, 2015.
Second Provisional Rejection dated Feb. 27, 2017 for KR Patent Application No. 10-2016-7014087.
Street et al., "Jet Printing of Active-Matrix TFT Backplanes for Displays and Sensors", IS&T Archiving, Dec. 2005, vol. 20, No. 5, 16 pages.
Third Office Action dated Feb. 27, 2018, to CN Patent Application No. 201480027671.5.
Third Office Action issued to CN Patent Application 201210596572 dated Jan. 26, 2016.
TW Examination Report and Search Report dated Mar. 13, 2017 for TW Patent Application No. 105144240.
Applicant-Initiated Interview Summary dated May 30, 2018, to U.S. Appl. No. 15/184,755.
Corrected Notice of Allowability dated Oct. 23, 2018, to U.S. Appl. No. 14/996,086.
Examination report dated Aug. 13, 2018, to TW Patent Application 106145084.
Extended EP Search Report dated Oct. 1, 2018, to EP Patent Application No. 15863357.8.
Interview Summary dated Oct. 23, 2018, to U.S. Appl. No. 14/966,086.
Non-Final Office Action dated Jun. 29, 2018, to U.S. Appl. No. 15/605,806.
Non-Final Office action dated Oct. 17, 2018, to U.S. Appl. No. 15/446,984.
Notice of Allowability dated Jun. 29, 2018, to U.S. Appl. No. 14/275,637.
Notice of Allowance dated Aug. 24, 2018, to U.S. Appl. No. 15/409,844.
Notice of Allowance dated Feb. 9, 2018, for U.S. Appl. No. 14/275,637.
Notice of Allowance dated Jun. 21, 2018, to U.S. Appl. No. 15/409,844.
Notice of Allowance dated Jun. 29, 2018, to U.S. Appl. No. 15/184,755.
Notice of Allowance dated Mar. 26, 2018, to U.S. Appl. No. 15/409,844.
Notice of Allowance dated May 24, 2018, to U.S. Appl. No. 15/409,844.
Notice of Allowance dated Nov. 24, 2017, to U.S. Appl. No. 14/275,637.
Notice of Allowance dated Oct. 18, 2018, to U.S. Appl. No. 14/543,786.
Notice of Allowance dated Sep. 13, 2017, to U.S. Appl. No. 14/275,637.
Notice of Allowance dated Sep. 17, 2018, to U.S. Appl. No. 15/184,755.
Notice of Allowance dated Sep. 24, 2018, to U.S. Appl. No. 14/275,637.

(56) References Cited

OTHER PUBLICATIONS

Notice of Allowance dated Sep. 26, 2018, to U.S. Appl. No. 14/996,086.
Official Action dated Sep. 25, 2018, to JP Patent Application No. 2017-522824.
Provisional Rejection dated Jul. 6, 2018, to KR Patent Application No. 9-5-2018-046228232.
Provisional Rejection dated Sep. 10, 2018, to KR Patent Application No. 10-2018-7016567.
Rejection Decision dated Jul. 25, 2018, to TW Patent Application No. 103117122.
Supplemental Notice of Allowance dated Nov. 1, 2017, to U.S. Appl. No. 14/275,637.

* cited by examiner

ENVIRONMENTALLY CONTROLLED COATING SYSTEMS

CROSS REFERENCE TO RELATED CASES

This application is a continuation of International Application No. PCT/US15/62777, filed Nov. 25, 2015. International Application No. PCT/US15/62777 claims benefit of U.S. Provisional Application 62/085,211, filed on Nov. 26, 2014. All applications listed herein are hereby incorporated by reference, each in its entirety.

OVERVIEW

Embodiments of an enclosed coating system according to the present teachings can be useful for patterned area coating of substrates in the manufacture of a variety of devices and apparatuses in a wide range of technology areas, for example, but not limited by, OLED displays, OLED lighting, organic photovoltaics, Perovskite solar cells, and organic semiconductor circuits.

For example, by way of a non-limiting example, for RGB OLED displays, though the demonstration of OLED displays for small screen applications, primarily for cell phones, has served to emphasize the potential of the technology, challenges remain in scaling high volume manufacturing across a range of substrate formats in high yield for RGB OLED. With respect to scaling of formats for RGB OLED display technology, a Gen 5.5 substrate has dimensions of about 130 cm×150 cm and can yield about eight 26" flat panel displays. In comparison, larger format substrates can include using Gen 7.5 and Gen 8.5 mother glass active area sizes. A Gen 7.5 mother glass has dimensions of about 195 cm×225 cm, and can be cut into eight 42" or six 47" flat panel displays per substrate. The mother glass used in Gen 8.5 is approximately 220 cm×250 cm, and can be cut to six 55" or eight 46" flat panel displays per substrate. One indication of the challenges that remain in scaling of RGB OLED display manufacturing to larger formats is that the high-volume manufacture of RGB OLED displays in high yield on substrates larger than Gen 5.5 substrates has proven to be substantially challenging.

In principle, various materials comprising an RGB OLED stack structure can be susceptible to damage by oxidation and other chemical processes. Moreover, until the active area containing such RGB OLED materials can be effectively hermetically sealed, the various materials in an RGB OLED device or apparatus active area are subject to degradation by various reactive gaseous species, such as, for example, but not limited by, water vapor, oxygen, ozone, organic solvent vapors, and the like. Similar considerations with respect to degradation during processing are apparent in the manufacture of other types of electronic devices, such as OLED lighting, organic photovoltaics, Perovskite solar cells, and organic semiconductor circuits. According to the present teachings, various embodiments of an environmentally controlled coating system can be configured to coat an organic film layer over a variety of electronic devices.

However, housing a coating system in a fashion that can be scaled for various devices and device sizes and can be done in an inert, substantially low-particle process environment can present a variety of engineering challenges. For example, manufacturing tools for high throughput large-format substrate coating, for example, substrates equivalent to the coating of Gen 7.5 and Gen 8.5 substrates for various OLED devices, require substantially large facilities. Accordingly, maintaining a large facility under an inert atmosphere, requiring gas purification to remove reactive atmospheric species, such as by way of non-limiting examples, water vapor, ozone and oxygen, as well as organic solvent vapors, as well as maintaining a substantially low-particle process environment, has proven to be significantly challenging.

As such, challenges remain in scaling high volume coating systems for the manufacturing of a variety of electronic devices and apparatuses across a range of device sizes in high yield. Accordingly, there exists a need for various embodiments an environmentally controlled, enclosed coating system housed in an inert, substantially low-particle environment, that can be readily scaled to provide for coating of a variety of electronic devices and apparatuses, which may have a variety of active area aspect ratios and sizes, as well as a variety of device and apparatus materials. Additionally, various enclosed, environmentally-controlled coating systems of the present teachings can provide for ready access to a coating system from the exterior during processing and ready access to the interior for maintenance with minimal downtime.

BRIEF DESCRIPTION OF THE DRAWINGS

A better understanding of the features and advantages of the present disclosure will be obtained by reference to the accompanying drawings, which are intended to illustrate, not limit, the present teachings.

DETAILED DESCRIPTION OF THE DISCLOSURE

Figure 1:
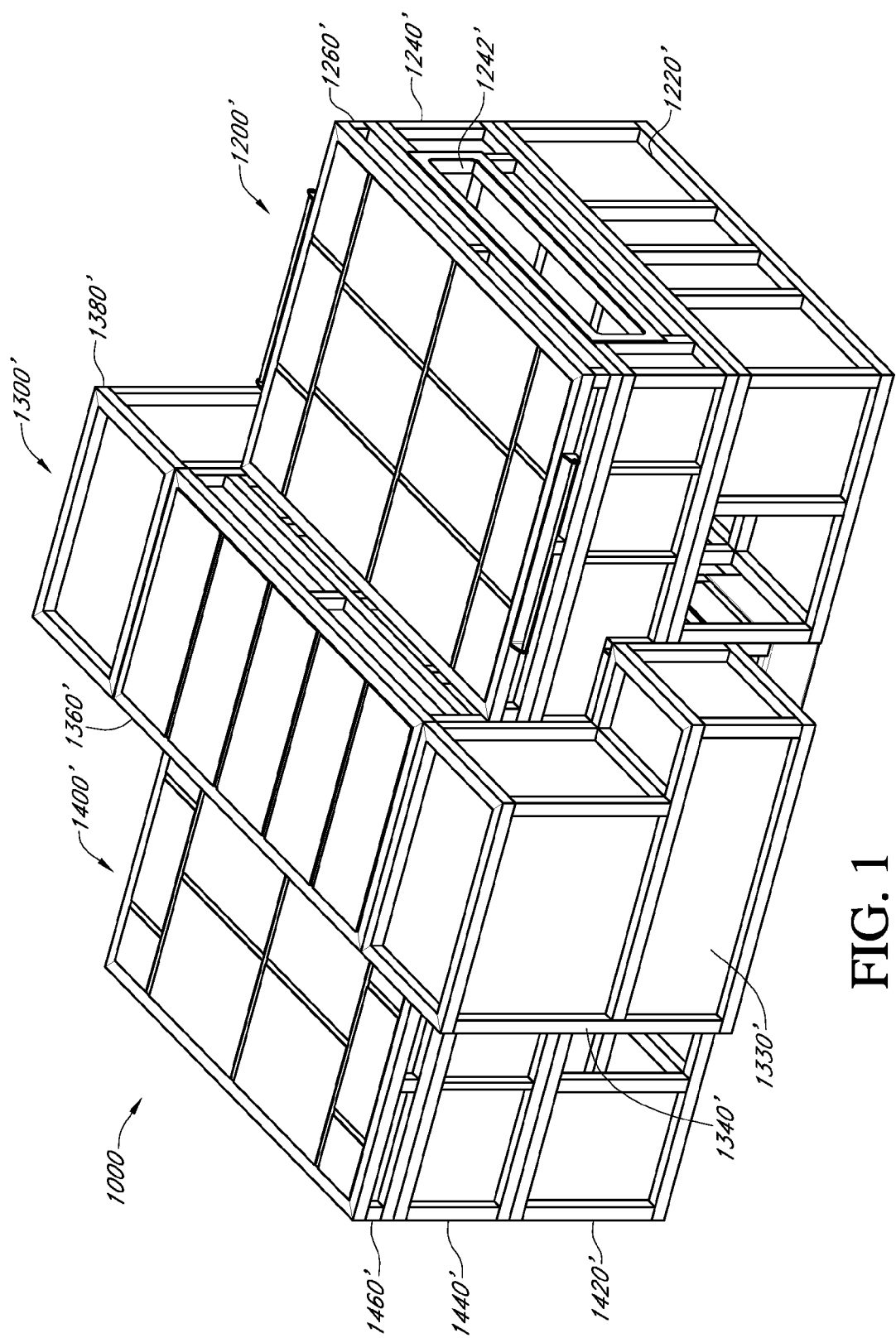
FIG. 1 is a front perspective view of view of an enclosure assembly for a coating system in accordance with various embodiments of the present teachings.

The present teachings disclose various embodiments of an enclosed coating system that can be maintained in an enclosure assembly, which can provide a controlled coating environment. Various embodiments of an enclosure assembly can be sealably constructed and integrated with various components that provide a gas circulation and filtration system, a particle control system, a gas purification system, and a thermal regulation system and the like to form various embodiments of an enclosed coating system that can sustain an inert gas environment that is substantially low-particle for various coating processes of the present teachings that require such an environment. Various embodiments of an enclosure assembly can have a coating system enclosure and an auxiliary enclosure constructed as a section of an enclosure assembly, for which the auxiliary enclosure can be sealably isolated from the coating system enclosure. Embodiments of an enclosed coating system according to the present teachings can be useful for patterned area coating of substrates in the manufacture of a variety of apparatuses and devices in a wide range of technology areas, for example, but not limited by, OLED displays, OLED lighting, organic photovoltaics, Perovskite solar cells, and organic semiconductor circuits.

According to the present teachings, for example, but not limited by, an organic encapsulation layer can be coated on the active area of various embodiments of various OLED-based devices and apparatuses using patterned coating technology. Embodiments of an enclosed coating system according to the present teachings can be useful for patterned area coating of substrates in the manufacture of a variety of apparatuses and devices in a wide range of technology areas, for example, but not limited by, OLED displays, OLED lighting, organic photovoltaics, Perovskite solar cells, and organic semiconductor circuits. In various embodiments of environmentally controlled coating systems of the present teachings, various coating solutions can be coated using slot die coating. as slot die coating can provide several advantages. First, a range of vacuum processing operations can be eliminated because such coating-based fabrication can be performed at atmospheric pressure. Additionally, during a slot die coating process, a coating solution or coating formulation can be localized to cover targeted portions of various devices and apparatuses to effectively cover such targeted portions of a substrate. Finally, the targeted patterning using coating results in eliminating material waste, as well as eliminating additional processing typically required to achieve patterning of an organic layer.

For example, various organic material formulations used for patterned coating with various embodiments of an enclosed coating apparatus of the present teachings can have a wide range of physical properties, such as viscosity and surface tension. An organic material formulation deposited using an enclosed coating apparatus of the present teachings can comprise a polymer including, for example, but not limited by, an acrylate, methacrylate, urethane, or other material, as well as copolymers and mixtures thereof, which can be cured using thermal processing (e.g. bake), UV exposure, and combinations thereof. As used herein polymer and copolymer can include any form of a polymer component that can be formulated into a coating solution and cured on a substrate to form a uniform polymeric layer. Such polymeric components can include polymers, and copolymers, as well as precursors thereof, for example, but not limited by, monomers, oligomers, and resins.

Figure 2A:
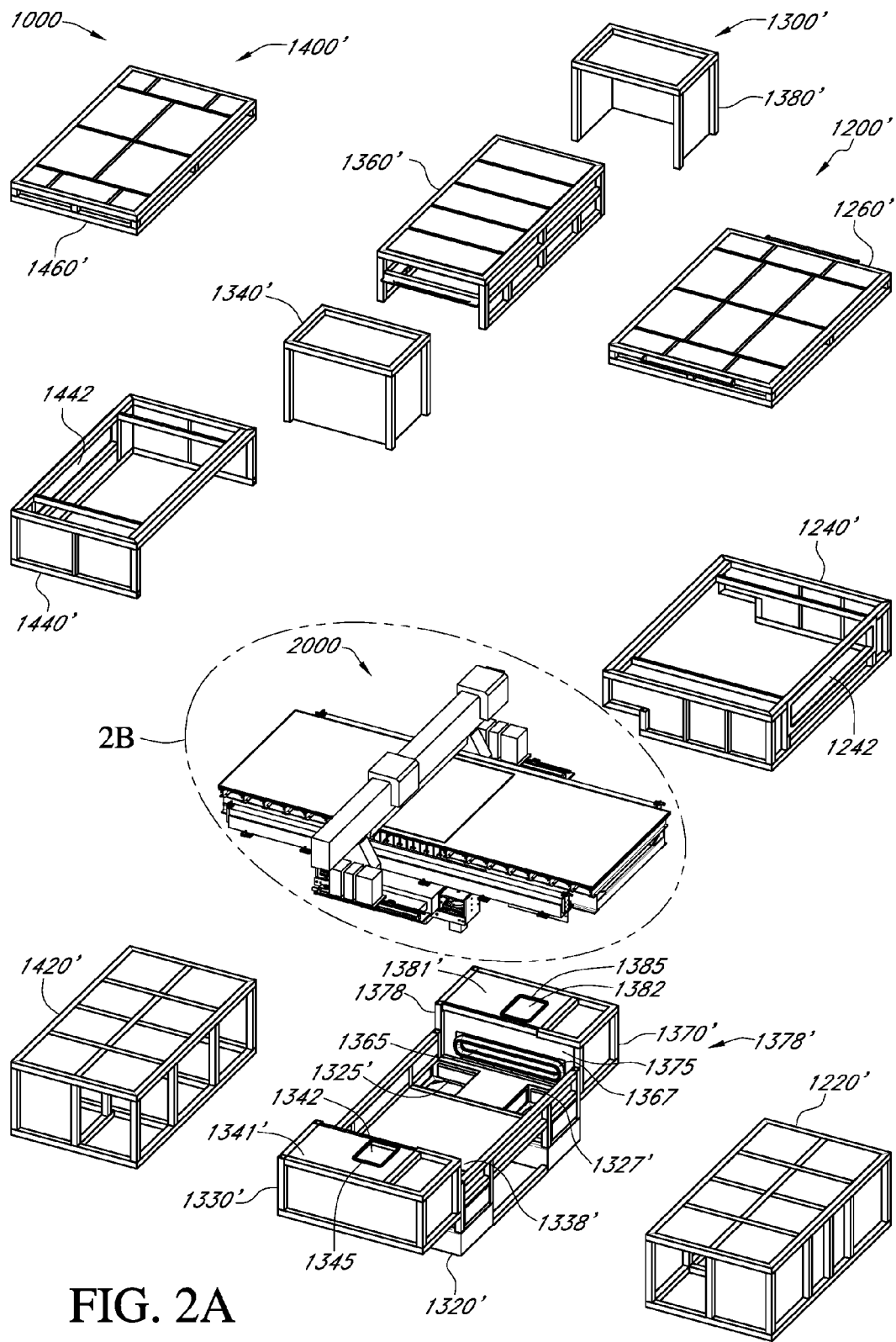
FIG. 2A depicts an exploded view of various embodiments of an enclosed coating system as in an enclosure as depicted in FIG. 1.
Figure 2B:
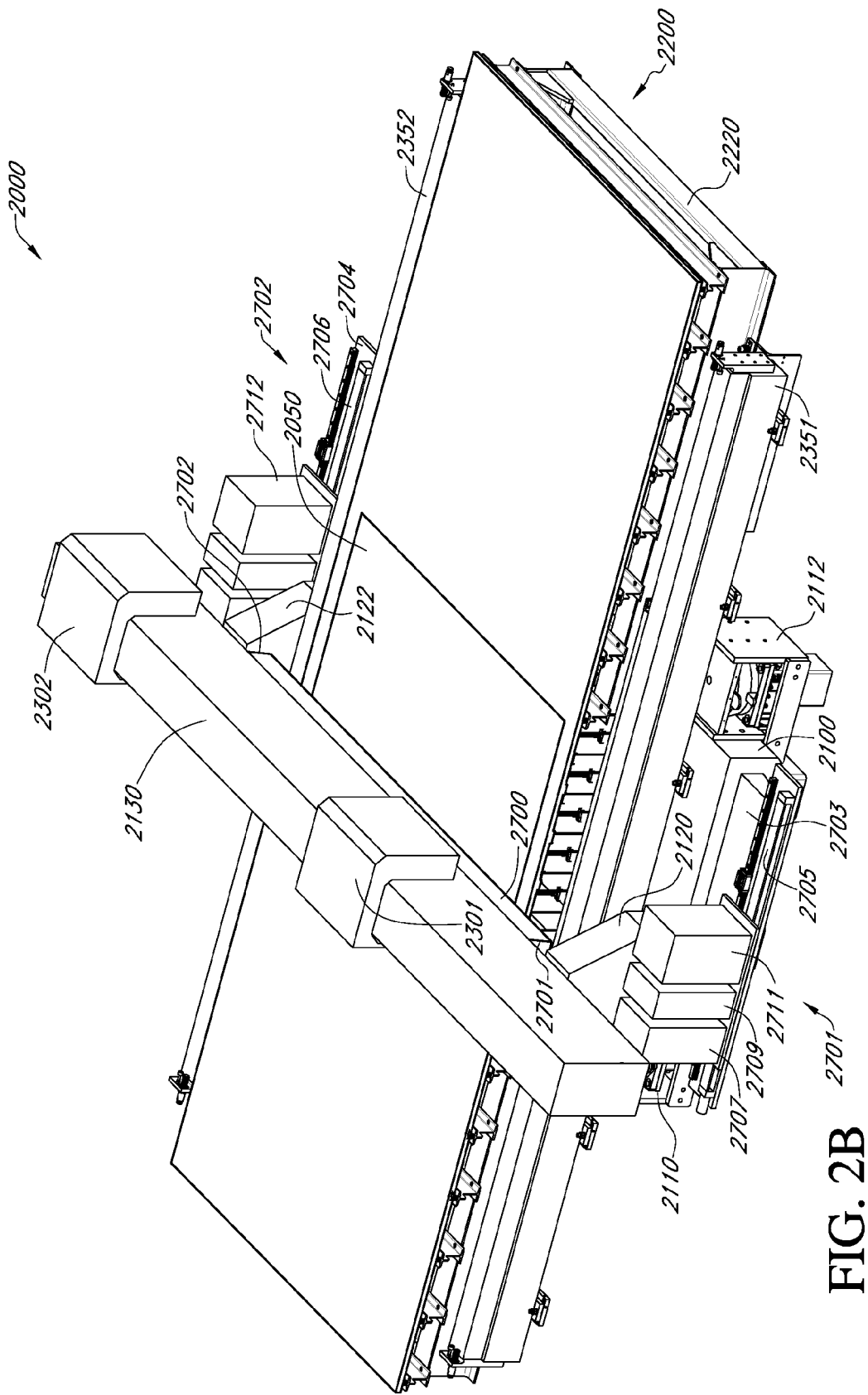
FIG. 2B depicts an expanded iso perspective view of the coating system depicted in FIG. 2A.

An enclosed coating apparatus, such as coating apparatus 2000 of FIG. 2A, shown in expanded view in FIG. 2B, can be comprised of several devices and apparatuses, which allow the reliable coating of a coating solution onto specific locations of substrate active areas for various OLED-based devices and apparatuses. Coating requires relative motion between the coating assembly and the device or apparatus substrate. This can be accomplished with a motion system, typically a gantry or split axis XYZ system. Either the coating assembly can move over a stationary substrate (gantry style), or both the coating assembly and substrate can move, in the case of a split axis configuration. In another embodiment, a coating assembly can be substantially stationary; for example, in the X and Y axes, and the substrate can move in the X and Y axes relative to a coating die assembly, with Z axis motion provided either by a substrate support apparatus or by a Z-axis motion system associated with a coating assembly. A substrate can be inserted and removed from the coating apparatus using a substrate loading and unloading system. Depending on the coating apparatus configuration, this can be accomplished with a mechanical conveyor, a substrate floatation table with a conveyance assembly, or a substrate transfer robot with end effector. For various embodiments of systems and methods of the present teachings, an Y-axis motion system can be based on an air-bearing gripper system.

Manufacturing tools that in principle can allow for the coating of a variety of device active area sizes; including large-format active area sizes, can require substantially large facilities for housing such manufacturing tools. Accordingly, maintaining an entire large facility under an inert atmosphere presents engineering challenges, such as continual purification of a large volume of an inert gas. Various embodiments of an enclosed coating system can have a circulation and filtration system internal an enclosure assembly in conjunction with a gas purification system external a gas enclosure that together can provide continuous circulation of a substantially low-particulate inert gas having substantially low levels of reactive species throughout an enclosed coating system. According to the present teachings, an inert gas may be any gas that does not undergo a chemical reaction under a defined set of process conditions. Some commonly used non-limiting examples of an inert gas can include nitrogen, any of the noble gases, and any combination thereof. Additionally, providing a large facility that is essentially hermetically sealed to prevent contamination of various reactive atmospheric gases, such as water vapor, oxygen, and ozone, as well as, for example, organic solvent vapors generated from various coating solutions, poses an engineering challenge. According to the present teachings, a coating facility would maintain levels for each species of various reactive species, including various reactive atmospheric gases, such as water vapor, oxygen, and ozone, as well as organic solvent vapors at 100 ppm or lower, for example, at 10 ppm or lower, at 1.0 ppm or lower, or at 0.1 ppm or lower.

By way of a non-limiting example meant to illustrate the need for maintaining levels of reactive species in the manufacture of various electronic devices, the information presented in Table I is illustrative of the sensitivity of various OLED emissive materials to environmental conditions. The data summarized on Table 1 resulted from the testing of each of a test coupon comprising organic thin film compositions for each of red, green, and blue, fabricated in a large-pixel, spin-coated device format. Such test coupons are substantially easier to fabricate and test for the purpose of rapid evaluation of various formulations and processes of various OLED devices. Though test coupon testing should not be confused with lifetime testing of a fabricated OLED device, it can be indicative of the impact of various formulations and processes on lifetime. The results shown in the table below represent variation in the process step in the fabrication of test coupons in which only the spin-coating environment varied for test coupons fabricated in a nitrogen environment where reactive species were less than 1 ppm compared to test coupons similarly fabricated but in air instead of a nitrogen environment.

It is evident through the inspection of the data in Table 1 for test coupons fabricated under different processing environments, particularly in the case of red and blue, that fabrication of an OLED device in an environment that effectively reduces exposure of various organic thin film compositions to reactive species may have a substantial impact on the stability of various OLED materials, and hence on device lifetime. The lifetime specification is of particular significance for various OLED technologies, as this correlates directly to product longevity; which has been challenging for various OLED-based technologies to meet. In order to meet requisite lifetime specifications, levels of each of a reactive species, such as, but not limited by, water vapor, oxygen, ozone, as well as organic solvent vapors, can be maintained at 100 ppm or lower, for example, at 10 ppm or lower, at 1.0 ppm or lower, or at 0.1 ppm or lower with various embodiments of an enclosed coating system of the present teachings. These data emphasize the need for maintaining controlled environmental conditions for various OLED devices and apparatuses being fabricated until the hermetic sealing of an OLED active area has been achieved.

TABLE 1

Impact of inert gas processing on lifetime for OLED panels

| Color | Process Environment | V @ 10 mA/cm$^2$ | Cd/A | CIE (x, y) | T95 | T80 | T50 |
|---|---|---|---|---|---|---|---|
| | | | | @ 1000 Cd/m$^2$ | | | |
| Red | Nitrogen | 6 | 9 | (0.61, 0.38) | 200 | 1750 | 10400 |
| | Air | 6 | 8 | (0.60, 0.39) | 30 | 700 | 5600 |
| Green | Nitrogen | 7 | 66 | (0.32, 0.63) | 250 | 3700 | 32000 |
| | Air | 7 | 61 | (0.32, 0.62) | 250 | 2450 | 19700 |
| Blue | Nitrogen | 4 | 5 | (0.14, 0.10) | 150 | 750 | 3200 |
| | Air | 4 | 5 | (0.14, 0.10) | 15 | 250 | 1800 |

In addition to providing an inert environment, maintaining a substantially low-particle environment for OLED-based technologies is of particular importance, as even very small particles can lead to a visible defects in an end product. Particle control in an enclosed coating system can present significant challenges not presented for processes that can be done, for example, in atmospheric conditions under open air, high flow laminar flow filtration hoods. For example, a manufacturing facility can require a substantial length of various service bundles that can be operatively connected from various systems and assemblies to provide optical, electrical, mechanical, and fluidic connections required to operate, for example, but not limited by, a coating system. Such service bundles used in the operation of a coating system and located proximal to a substrate positioned for coating can be an ongoing source of particulate matter. Additionally, components used in a coating system, such as fans or linear motion systems that use friction bearing, can be particle generating components. Various embodiments of a gas circulation and filtration system in conjunction with various embodiments of ductwork of the present teachings can be used to contain and effectively filter particulate matter. Additionally, by using a variety of intrinsically low-particle generating pneumatically operated components, such as, but not limited by, substrate floatation tables, air bearings, and pneumatically operated robots, and the like, a low particle environment for various embodiments of an enclosed coating system can be maintained. For example, various embodiments of a gas circulation and filtration system can be designed to provide a low particle inert gas environment for airborne particulates meeting the standards of International Standards Organization Standard (ISO) 14644-1:1999, "Cleanrooms and associated controlled environments—Part 1: Classification of air cleanliness," as specified by Class 1 through Class 5. However, controlling airborne particulate matter alone is not sufficient for providing a low-particle environment proximal to a substrate during, for example, but not limited by, a coating process, as particles generated proximal to a substrate during such a process can accumulate on a substrate surface before they can be swept through a gas circulation and filtration system.

With respect to airborne particulate matter and particle deposition within a system, a substantial number of variables can impact developing a general model that may adequately compute, for example, an approximation of a value for particle fallout rate on a surface, such as a substrate, for any particular manufacturing system. Variables such as the size of particles, the distribution of particles of particular size; surface area of a substrate and the time of exposure of a substrate within a system can vary depending on various manufacturing systems. For example, the size of particles and the distribution of particles of particular size can be substantially impacted by the source and location of particle-generating components in various manufacturing systems. Calculations based on various embodiments of enclosed coating systems of the present teachings suggest that without various particle control systems of the present teachings, on-substrate deposition of particulate matter per coating cycle per square meter of substrate can be between more than about 1 million to more than about 10 million particles for particles in a size range of 0.1 μm and greater. Such calculations suggest that that without various particle control systems of the present teachings, on-substrate deposition of particulate matter per coating cycle per square meter of substrate can be between more than about 1000 to about more than about 10,000 particles for particles in a size range of about 2 μm and greater.

Various embodiments of a low-particle coating system of the present teachings can maintain a low-particle environment providing for an average on-substrate particle distribution that meets an on-substrate deposition rate specification of less than or equal to about 100 particles per square meter of substrate per minute for particles greater than or equal to 10 μm in size. Various embodiments of a low-particle coating system of the present teachings can maintain a low-particle environment providing for an average on-substrate particle distribution that meets an on-substrate deposition rate specification of less than or equal to about 100 particles per square meter of substrate per minute for particles greater than or equal to 5 μm in size. In various embodiments of an enclosed coating system of the present teachings, a low-particle environment can be maintained providing for an average on-substrate particle distribution that meets an on-substrate deposition rate specification of less than or equal to about 100 particles per square meter of substrate per minute for particles greater than or equal to 2 μm in size. In various embodiments of an enclosed coating system of the present teachings, a low-particle environment can be maintained providing for an average on-substrate particle distribution that meets an on-substrate deposition rate specification of less than or equal to about 100 particles per square meter of substrate per minute for particles greater than or equal to 1 µm in size. Various embodiments of a low-particle coating system of the present teachings can maintain a low-particle environment providing for an average on-substrate particle distribution that meets an on-substrate deposition rate specification of less than or equal to about 1000 particles per square meter of substrate per minute for particles greater than or equal to 0.5 µm in size. For various embodiments of an enclosed coating system of the present teachings, a low-particle environment can be maintained providing for an average on-substrate particle distribution that meets an on-substrate deposition rate specification of less than or equal to about 1000 particles per square meter of substrate per minute for particles greater than or equal to 0.3 µm in size. Various embodiments of a low-particle coating system of the present teachings can maintain a low-particle environment providing for an average on-substrate particle distribution that meets an on-substrate deposition rate specification of less than or equal to about 1000 particles per square meter of substrate per minute for particles greater than or equal to 0.1 µm in size.

Various embodiments of an enclosure assembly can have various frame members that are constructed to provide contour for an enclosed coating system. Various embodiments of an enclosure assembly of the present teachings can accommodate a coating system, while optimizing the working space to minimize inert gas volume, and also allowing ready access to an enclosed coating system from the exterior during processing. In that regard, various an enclosure assemblies of the present teachings can have a contoured topology and volume. As will be discussed in more detail subsequently herein, various embodiments of a coating system enclosure can be contoured around a coating system base, upon which a substrate support apparatus can be mounted. Further, a coating system enclosure can be contoured around a bridge structure that can be used, for example, for the X-axis movement of a carriage assembly. As a non-limiting example, various embodiments of a contoured coating system enclosure according to the present teachings can have a volume of between about 6 $m^3$ to about 95 $m^3$ for housing various embodiments of a coating system capable of coating various active area sizes corresponding to, for example, substrates for various OLED-based technologies, for example OLED display device substrates of Gen 3.5 to Gen 10 active area sizes. By way a further non-limiting example, various embodiments of a contoured gas enclosure according to the present teachings can have a gas enclosure volume of between about 15 $m^3$ to about 30 $m^3$ for housing various embodiments of a coating system capable of coating, for example, Gen 5.5 to Gen 8.5 active area sizes. Such embodiments of a contoured gas enclosure can be between about 30% to about 70% savings in volume in comparison to a non-contoured enclosure having non-contoured dimensions for width, length and height.

FIG. 1 depicts a perspective view enclosure assembly 1000 in accordance with various embodiments of an enclosed coating system of the present teachings. Enclosure assembly 1000 can include front panel assembly 1200', middle panel assembly 1300' and rear panel assembly 1400'. Front panel assembly 1200' can include front ceiling panel assembly 1260', front wall panel assembly 1240', which can have opening 1242 for receiving a substrate, and front base panel assembly 1220'. Rear panel assembly 1400' can include rear ceiling panel assembly 1460', rear wall panel assembly 1440' and rear base panel assembly 1420'. Middle panel assembly 1300' can include first middle enclosure panel assembly 1340', middle wall and ceiling panel assembly 1360' and second middle enclosure panel assembly 1380', as well as middle base panel assembly 1320'.

Additionally, as depicted in FIG. 1, middle panel assembly 1300' can include first auxiliary panel assembly, as well as a second auxiliary panel assembly (not shown). Various embodiments of an auxiliary enclosure constructed as a section of an enclosure assembly can be sealably isolated from the working volume of an enclosed coating system. For various embodiments of systems and methods of the present teachings, an auxiliary enclosure can be less than or equal to about 1% of an enclosure assembly volume. In various embodiments of systems and methods of the present teachings, an auxiliary enclosure can be can be less than or equal to about 2% of an enclosure assembly volume. For various embodiments of systems and methods of the present teachings, an auxiliary enclosure can be less than or equal to about 5% of the enclosure assembly volume. In various embodiments of systems and methods of the present teachings, an auxiliary enclosure can be less than or equal to about 10% of the enclosure assembly volume. In various embodiments of systems and methods of the present teachings, an auxiliary enclosure can be less than or equal to about 20% of the enclosure assembly volume. Should the opening of an auxiliary enclosure to an ambient environment containing reactive gases be indicated for performing, for example, a maintenance procedure, isolating an auxiliary enclosure from the working volume of a coating system enclosure can prevent contamination of the coating system enclosure. Further, given the relatively small volume of an auxiliary enclosure in comparison to an enclosure assembly, the recovery time for an auxiliary enclosure can take significantly less time than recovery time for an entire enclosure assembly.

As depicted in FIG. 2A, enclosure assembly 1000 can include front base panel assembly 1220', middle base panel assembly 1320', and rear base panel assembly 1420', which when fully-constructed form a contiguous base or pan on which coating apparatus 2000 can be mounted. According to the present teachings, the various frame members and panels comprising front panel assembly 1200', middle panel assembly 1300', and rear panel assembly 1400' of enclosure assembly 1000 can be joined around coating apparatus 2000 to form a coating system enclosure. Front panel assembly 1200' can be contoured around coating apparatus 2000 mounted to form a first tunnel section of a gas enclosure. Similarly, rear panel assembly 1400' can be contoured around coating apparatus 2000 to form a second tunnel section of a gas enclosure. Additionally, middle panel assembly 1300' can be contoured around a coating apparatus 2000 to form a bridge section of a gas enclosure. A fully constructed enclosure assembly, such as enclosure assembly 1000, when integrated with various environmental control systems can form various embodiments of an enclosed coating system including various embodiments of an enclosed coating system, such as coating apparatus 2000. According to various embodiments of an enclosed coating system of the present teachings, environmental control of an interior volume defined by an enclosed coating system can include control of lighting, for example, by the number and placement of lights of a specific wavelength, control of particulate matter using various embodiments of a particle control system, control of reactive gas species using various embodiments of a gas purification system, and temperature control of an enclosed coating system using various embodiments of a thermal regulation system.

A coating apparatus, such as coating apparatus 2000 of FIG. 2A, shown in expanded view in FIG. 2B, can be comprised of several devices, assemblies and subassemblies, which allow the reliable placement of a coating solution or coating formulation onto specific locations on various OLED-based device and apparatus substrates. These various devices, assemblies, and subassemblies of a coating apparatus can include, but are not limited to, a coating assembly, coating solution delivery system, a motion system for providing relative motion between a coating assembly and a substrate, substrate support apparatus, substrate loading and unloading system.

For example, for slot die coating, slot die coating assembly 2800, having first side 2801 and second side 2802, of FIG. 2B can be a slot die coating assembly, capable of depositing a coating solution at controlled rate and thickness. Various embodiments of coating assembly 2800 can deposit a coating solution as a patterned area coating, for example, on a plurality of deposition region of a substrate. The phrase "deposition region" generally refers to a region where an organic material layer is being coated on a substrate. Slot die coating assembly 2800 can be in flow communication with a coating solution supply system (not shown) which provides a coating solution to slot die coating assembly 2800. As shown in an expanded view of FIG. 2B, coating apparatus 2000 can have a substrate, such as substrate 2050, which can be supported by a substrate support apparatus, such as a chuck, for example, but not limited by, a vacuum chuck, a substrate floatation chuck having pressure ports, and a substrate floatation chuck having vacuum and pressure ports. According to various embodiments of the present teachings, a support apparatus can be for example, but not limited by, a substrate floatation table having pressure ports, and a substrate floatation table having vacuum and pressure ports. Various embodiments of a chuck and a floatation table can be configured using a porous media to establish a uniform distributed vacuum, pressure or combination of vacuum and pressure. Various porous media used to configure a chuck or a floatation table of the present teachings can include a porous material such as a carbon or ceramic material, sintered glass, or some other material such as can include a pore size of less than 1 micrometer or even less than 0.5 micrometers in diameter. Such a small pore size can ensure the uniform distribution of vacuum, pressure, as well as the combination of vacuum and pressure that can be used to support a substrate.

In an illustrative example, the uniform height, or fly height, in a pressure-vacuum zone in comparison with a pressure only zone can be substantially different. The fly height of a substrate over a substrate support apparatus utilizing pressure and vacuum can be held at a precise Z-axis fly height over the entire area of a substrate, given the formation of a bidirectional fluid spring that can be formed using the combination of pressure and vacuum. A fly height of a substrate over a pressure-only zone may produce more variation of fly height over the area of a substrate than the precision of the fly height over the entirety of a substrate over a pressure-vacuum zone, due to the absence of vacuum preload in a pressure only zone. With respect to fly height, in an illustrative example, a substrate can have a fly height of between about 150 micrometers ($\mu$) to about 300$\mu$ above pressure-only zones, and then between about 30$\mu$ to about 50$\mu$ above a pressure-vacuum zone.

Substrate floatation table 2200 of FIG. 2B, in conjunction with a Y-axis motion system, can be part of a substrate conveyance system providing for the frictionless conveyance of substrate 2050. A Y-axis motion system of the present teachings can include first Y-axis track 2351 and second Y-axis track 2352, which can include a gripper system (not shown) for holding a substrate. Y-axis motion can be provided be either a linear air bearing or linear mechanical system. Substrate floatation table 2200 of coating apparatus 2000 shown in FIG. 2A and FIG. 2B can define the travel of substrate 2050 through enclosure assembly 1000 of FIG. 1 during a coating process.

With respect to FIG. 2B, coating apparatus base 2100, can include first riser 2120 and second riser 2122, upon which bridge 2130 is mounted. Additionally, first isolator set 2110 (second not shown on opposing side) and second isolator set 2112 (second not shown on opposing side) support substrate floatation table 2200 of coating apparatus 2000. For various embodiments of coating apparatus 2000, bridge 2130 can support first X-axis carriage assembly 2301 and second X-axis carriage assembly 2302, which can control the movement of various devices and assemblies that can be mounted on the X-axis carriages. For example, a Z-axis moving plate can be mounted to an X-axis carriage. In various embodiments of a coating apparatus of the present teachings, a coating assembly can be mounted to one or both of a Z-axis moving plate. In various embodiments of a coating apparatus of the present teachings, a coating assembly can be mounted to one of an X-axis carriage, and an inspection assembly can be mounted to the other X-axis carriage. For various embodiments of coating apparatus 2000, first X-axis carriage assembly 2301 and second X-axis carriage assembly 2302 can utilize a linear air bearing motion system, which are intrinsically low-particle generating. According to various embodiments of a coating system of the present teachings, an X-axis carriage can have a Z-axis moving plate mounted thereupon. In FIG. 2B, first X-axis carriage assembly 2301 is depicted with first Z-axis moving plate 2310, while second X-axis carriage assembly 2302 is depicted with second Z-axis moving plate 2312.

According to various embodiments of a coating system of the present teachings, given the continuous use of an automated industrial coating system, first maintenance system 2701 and second maintenance system 2702 can be housed in an auxiliary enclosure, which can be isolated from a coating system enclosure during a coating process for performing various maintenance tasks with little or no interruption to a coating process. As can be seen in FIG. 2B, maintenance modules 2707, 2709 and 2711 can be positioned proximal a coating apparatus, but as can be seen in FIG. 2A, positioned within an auxiliary enclosure, such as auxiliary enclosure 1330' and 1370' of FIG. 2A. Apparatuses 2707, 2709, and 2011 can be any of a variety of subsystems or modules for performing various maintenance functions. For example apparatuses 2707, 2709, and 2011 can be any of a module for storing or receiving a part for a system repair operation.

In the expanded view of coating apparatus 2000 of FIG. 2B, various embodiments of a coating system can include substrate floatation table 2200, supported by substrate floatation table base 2220. Substrate floatation table base 2220 can be mounted on coating apparatus base 2100. Substrate floatation table 2200 of enclosed coating system can support substrate 2050, as well as defining the travel over which substrate 2050 can be moved through enclosure assembly 1000 during the coating of an OLED substrate. A Y-axis motion system of the present teachings can include first Y-axis track 2351 and second Y-axis track 2352, which can include a gripper system (not shown) for holding a substrate. Y-axis motion can be provided by either a linear air bearing or linear mechanical system. In that regard, in conjunction with a motion system; as depicted in FIG. 2B, such as a Y-axis motion system, substrate floatation table 2200 can provide frictionless conveyance of substrate 2050 through a coating system.

Figure 2C:
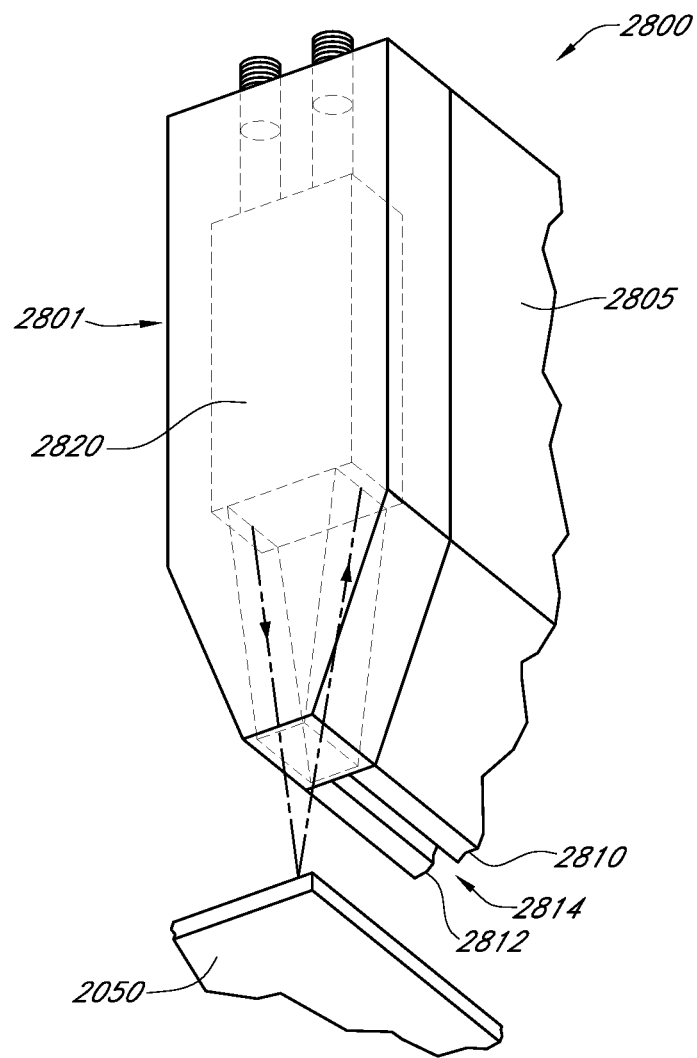
FIG. 2C is an expanded perspective view of a slot die coating apparatus indicated in FIG. 2B.

FIG. 2C depicts an expanded perspective cut-away view of first side 2801 of various embodiments of slot die coating assembly 2800 of FIG. 2B. A plurality of positioning sensors, such as position sensor 2820, can be operably connected to slot die coating assembly 2800, so that the position of slot die coating assembly 2800 relative to substrate 2050 of FIG. 2B can be continuously determined. As will be discussed in more detail subsequently herein, positioning can additionally be provided using various embodiments of a camera assembly. Positioning sensor 2820 can be, for example, a laser-based positioning system. Slot die assembly 2800 can include slot die 2805, having first lip 2812 and second lip 2814, between which slot die gap outlet 2814 is depicted. During a coating process, slot die 2805 is in flow communication with a coating solution, so that slot die gap outlet 2814 is at a predetermined distance from substrate 2050 of FIG. 2B. A coating solution flows from slot die gap outlet 2814 as substrate 2050 moves relative to coating assembly 2800 or FIG. 2B, forming a coating of fixed position, width and thickness on substrate 2050. Extremely flat and straight die surfaces, in conjunction with precise positioning of the die with respect to the substrate can provide patterned slot die coating in which film thickness uniformity of about 1% to about 3% of a target film thickness. In order to achieve good coating uniformity of films formed over a deposition region of a substrate, for patterned slot die coating, accurate and repeatable timing of the position of the die with a substrate, as well as proper timing of coating fluid flow start and stop with die movement, can be done to ensure that there will be no build-up at the leading edge, and that the trailing edge of an area of a substrate coated is uniformly straight and thick.

Figure 2D:
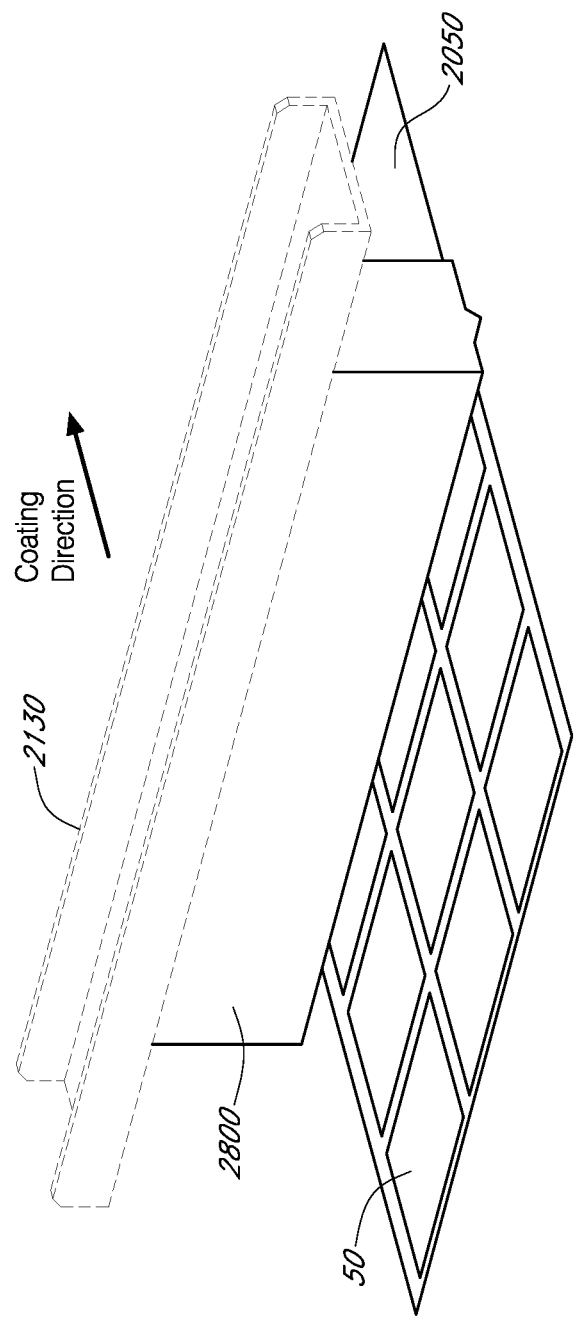
FIG. 2D is a schematic view of a slot die coating apparatus configured to provide patterned area coating on a substrate.

FIG. 2D schematically depicts a patterned coating of a substrate using a coating apparatus, such as described herein for coating apparatus 2000 of FIG. 2B. Shown in FIG. 2D is an array of patterned coating areas or deposition regions, such as patterned coating area or deposition region 50, on substrate 2050, using a slot die coating assembly, such as slot die coating assembly 2800 of FIG. 2B and FIG. 2C. The phrase "deposition region" generally refers to a region where an organic material layer is being coated on a substrate. According to the present teachings, various embodiments of a coating apparatus can provide patterned coating on a substrate that provide a coating film thickness of about 20 nm (nanometers) to about 150μ (microns) for a film coated over a deposition region of a substrate, with a film uniformity as previously stated of about 1% to about 3% of a target film thickness with coating accuracy of between about +/−100μ (microns) or less. According to the present teachings, various embodiments of a coating apparatus can provide patterned coating on a substrate that provide high substrate yields and effective material usage with low waste. Additionally, various formulations used for patterned coating with various embodiments of an enclosed coating apparatus of the present teachings can have a wide range of physical properties, such as viscosity and surface tension.

Figure 3A:
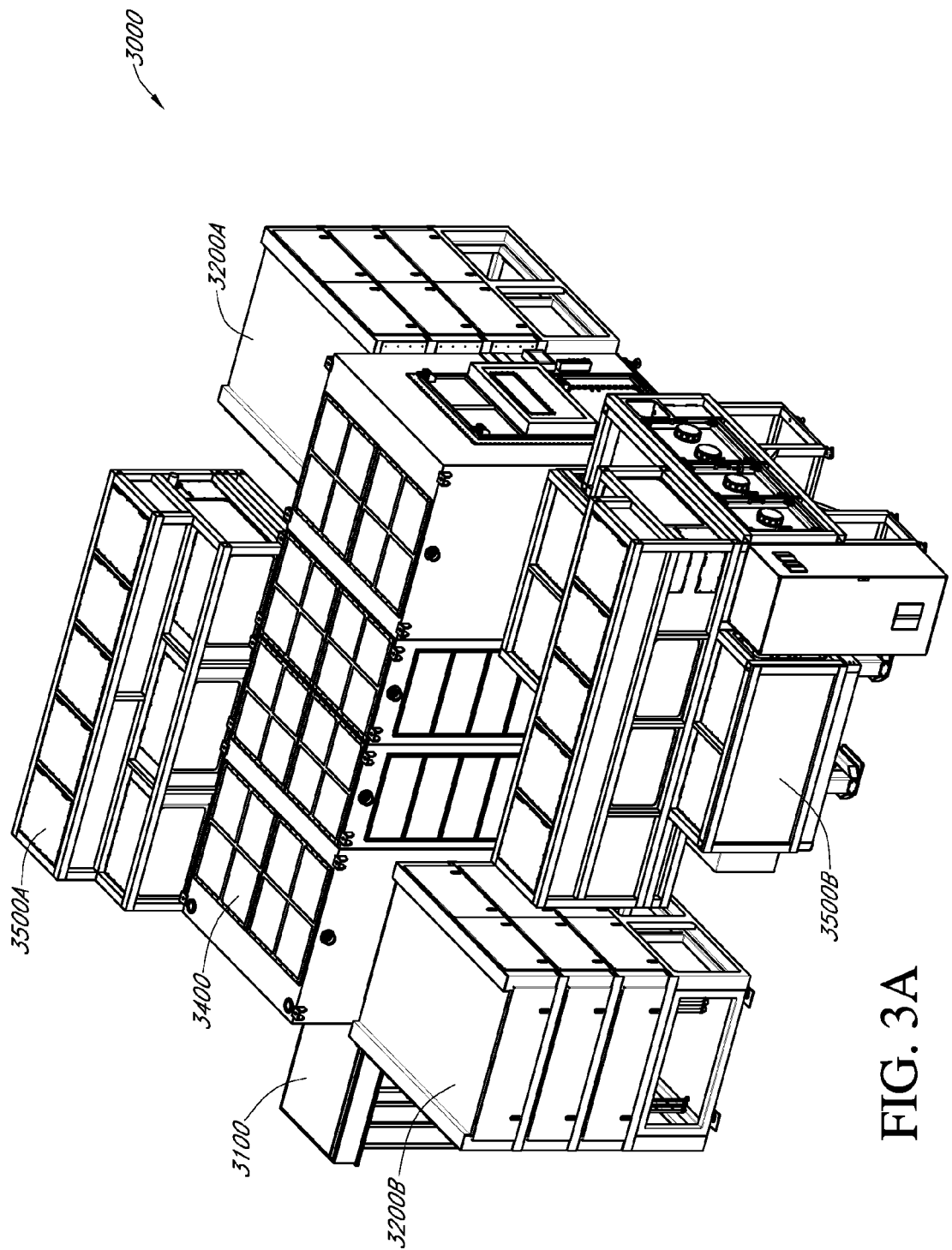
FIG. 3A illustrates generally an isometric view of at least a portion of a system, such as including a coating module and other modules.
Figure 3B:
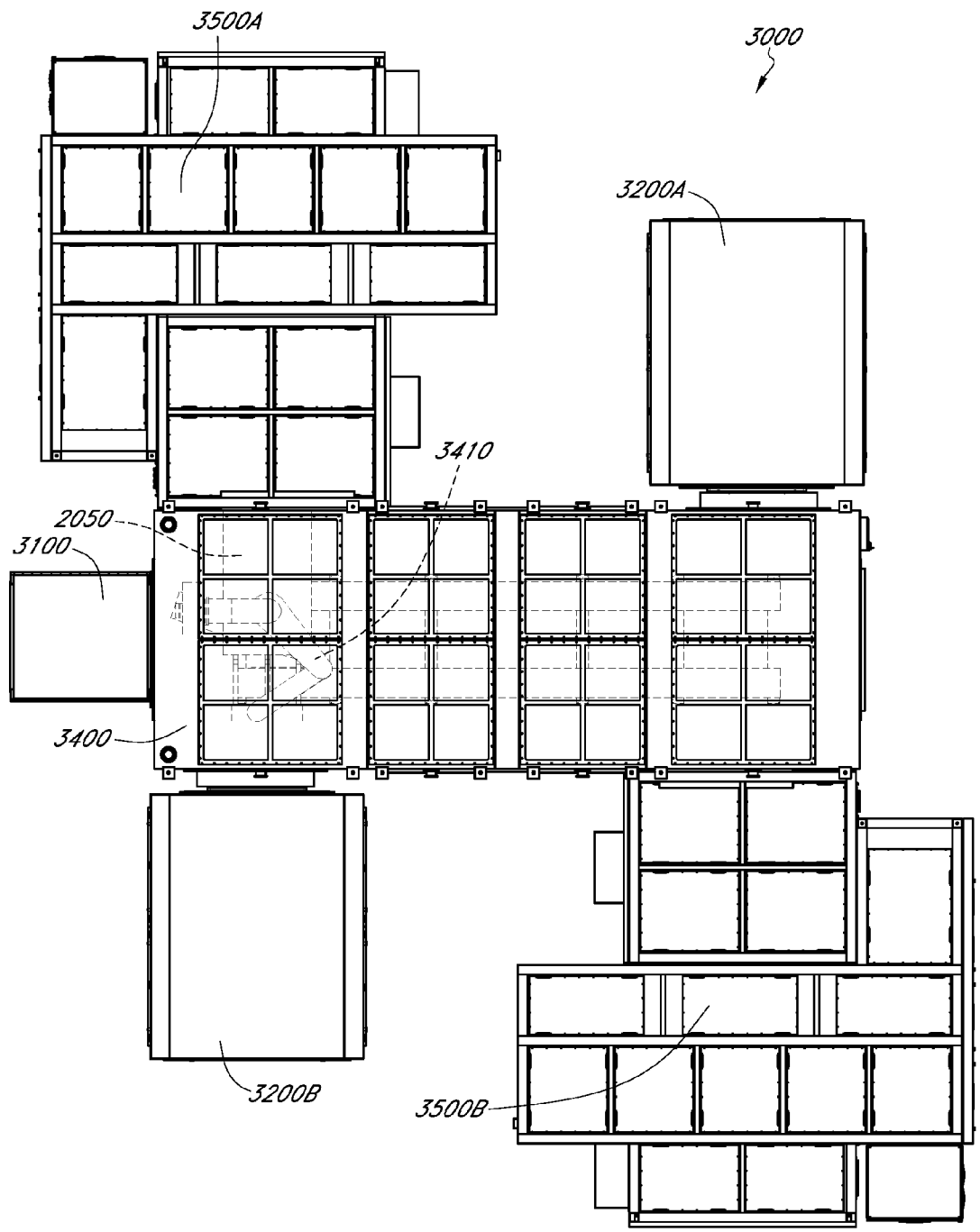
FIG. 3B illustrates a plan view of the system generally illustrated in FIG. 3A.

FIG. 3A illustrates generally an isometric view and FIG. 3B illustrates generally a plan view of at least a portion of an enclosed and environmentally controlled coating system 3000, such as including a first coating module 3500A, a second coating module 3500B, and other modules, that can be used in manufacturing various devices for example, but not limited by, OLED displays, OLED lighting, organic photovoltaics, Perovskite solar cells, and organic semiconductor circuits. In the manufacture of such devices, patterned coating can be done as part of the manufacturing process.

The an enclosed and environmentally controlled coating system 3000 can include a first coating module 3500A, that can include a coating apparatus, such as coating apparatus 2000 described in relation to other examples herein. In order to provide one or more of increased throughput, redundancy, or multiple processing operations, other coating systems can be included, such as a second coating module 3500B, which can also include a coating apparatus, such as coating apparatus 2000 as previously described herein. The system enclosed coating system 3000 can also include one or more other modules, such as first processing module 3200A or a second processing module 3200B.

According to the present teachings, first or second processing modules 3200A or 3200E can be used for one or more of holding a substrate (e.g., to facilitate flowing or dispersing the deposited material layer, such as to achieve a more planar or uniform film) or curing (e.g. via light illumination, such as illumination using UV radiation) a layer of material, such as deposited by one or more of the first or second coating modules 3500A or 3500B. For example, for a material layer that is coated on a substrate, or is cured, using the first or second processing modules 3200A or 3200E can include a portion of an encapsulation layer (such as a thin film layer comprising an organic encapsulant cured or treated via exposure to ultraviolet light). The first or second processing modules 3200A or 3200E can be configured for holding substrates as described above, such as in a stacked configuration. Processing module 3200B could alternatively (or additionally) be configured for vacuum drying one or more substrates, such as in a stacked configuration. In the case that one or more of the first or second processing modules 3200A or 3200E function as a vacuum drying module for more than one substrate at a time, the stacked configuration can include multiple drying slots in a single chamber or a stack of isolated chambers, each having a single drying slot. In yet another configuration, one or more of the first or second processing modules 3200A or 3200E can be configured for holding substrates and another processing module can be provided attached to a transfer module 3400 for vacuum drying one or more substrates. The first and second coating modules 3500A and 3500B can be used, for example, for depositing the same layers on a substrate or coating modules 3500A and 3500E can be used for depositing different layers on a substrate.

The enclosed coating system 3000 can include an input or output module 3100 (e.g., a "loading module"), such as can be used as a load-lock or otherwise in a manner that allows transfer of a substrate 2050 into or out of an interior of one or more chambers of the enclosed coating system 3000 in a manner that substantially avoids disruption of a controlled environment maintained within one or more enclosures of the enclosed coating system 3000. For example, in relation to FIG. 3A, "substantially avoids disruption" can refer to avoiding raising a concentration of a reactive species by a specified amount, such as avoiding raising such a species by more than 10 parts per million, 100 parts per million, or 1000 parts per million within the one or more enclosures during or after a transfer operation of a substrate 2050 into or out the one or more enclosures. A transfer module 3400, such as can include a handler 3410, can be used to manipulate the substrate 2050 before, during, or after various operations. One or more additional handlers can be included, such as to provide a substrate to the input or output module 3100 or receive a substrate from the input or output module

3100. Enclosed coating system 3000 can include an additional input or output module, for example, on the right side of transfer module 3400 clearly shown in FIG. 3A and FIG. 3B, opposite the side of transfer module 3400 that input or output module 3100 is shown in FIG. 3A and FIG. 3B.

Figure 4:
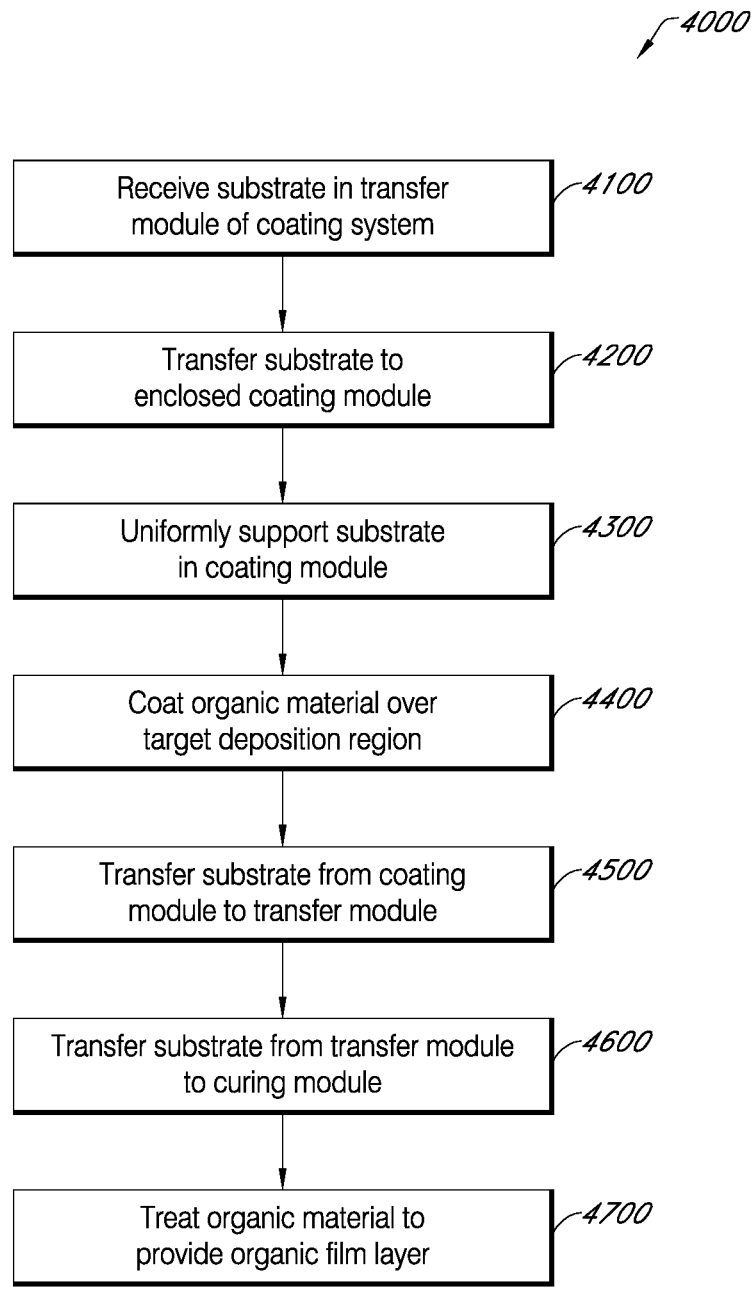
FIG. 4 illustrates a technique, such as a method, that can include coating an organic thin-film on a substrate.

FIG. 4 illustrates generally, a technique, such as a method, that can include forming an organic thin-film layer on a deposition region of an electronic device (e.g. OLED displays, OLED lighting, organic photovoltaics, Perovskite solar cells, and organic semiconductor circuits,). In the example 4000 of FIG. 4, at 4100, a substrate can be received in a transfer chamber, such as transfer module 3400 of FIG. 3A and FIG. 3B, as shown and described in relation to other examples herein. A substrate can be from an environment different from a controlled environment of the transfer module, such as using a loading module (e.g., "load lock"), such as loading module 3100 of FIG. 3A and FIG. 3B. At 4200, a substrate can be transferred to an enclosed coating module, such as at least in part using a handler robot, such as handler robot 3410 located within transfer module 3400 of FIG. 3A and FIG. 3B. Alternatively, a handler robot can be housed within the enclosed coating module. At 4300, a substrate can be uniformly supported in a coating module, such as using techniques and apparatuses to reduce or inhibit formation of visible defects during coating operations or other operations.

For example, such substrate support can include a chuck (e.g., a planar chuck or tray) or a floatation table such as configured to provide uniform physical contact in areas of the substrate upon or opposite regions of the substrate where active electronic devices have been formed. This, however, can present a variety of challenges because, for example, various substrate support apparatuses generally provide holes in central regions of the substrate through which lift pins can raise and lower the substrate, so as to facilitate loading and unloading operations. These holes can represent regions of non-uniform physical contact with a substrate. In the example of a vacuum chuck, there can also be grooves or holes through which the vacuum suction is provided that holds a substrate in place, and generally some of such groove or hole features are located in the central region of a substrate to achieve desired hold-down performance.

The present inventors have recognized, among other things, that a substrate support apparatus, such as a chuck or floatation table (or other portion of the system supporting the substrate), can be configured so as to position substrate support apparatus features to minimize or eliminate their impact on a target coating pattern. In an example, a substrate support apparatus, such as a chuck or a floatation table, can further provide non-uniform physical contact to certain areas of the substrate upon or opposite regions of the substrate outside where active electronic devices have been formed. The present inventors have also recognized that uniform support of a substrate can be addressed by using a chuck having a distributed vacuum region instead of individual vacuum grooves or holes, such as a continuous porous medium through which vacuum suction is provided. Remaining holes in the chuck associated with the lift pins can be located at one or more of a periphery of a substrate or a periphery of active regions (including regions opposite a surface defining a periphery of a substrate or a periphery of active regions of the substrate). In these examples, the same support structure configurations can be applied to any active electronic, optical, or optoelectronic devices, wherein the active region can represent a region within which the devices being coated are located.

Alternatively, for example, the present inventors have also recognized, among other things, that a substrate can be uniformly supported by a chuck or floatation table at least in part using a gas cushion, such as during one or more of a coating operation or other processing such as before or during ultraviolet treatment in a curing module. Use of such a gas cushion can enhance uniformity of a coated organic material or treated organic film layer on a substrate. For example, by floating a substrate above a physical substrate support surface, a substrate is uniformly supported by a gas in all of regions and is relatively less sensitive to the presence of holes for lift pins, lift pins, or other localized features that may be present on physical substrate support surface. In such a floating support example, lift pins in the center region of a substrate can be incorporated into the support mechanism without affecting film uniformity in those areas because a substrate is not in physical contact with extended or retracted lift pins and is supported by a gas cushion in the center region during processing such as coating, holding, or curing. In addition, or instead, a substrate can be further uniformly supported or retained by physical contact restricted to regions outside such active regions, such as in one or more of a substrate periphery or a periphery between active regions. In this way, all of a substrate area can offer a highly uniform coating and can be used productively, except, potentially, for an exclusion zone at the substrate edge where the substrate is physically contacted so as to constraint or hold it in place in the floatation plane.

At 4400, an organic material formulation can be coated in a target deposition region of a substrate, such as including a polymer component to form a uniform organic material untreated layer. The phrase "deposition region" generally refers to the region where an organic material layer is being coated on a substrate. At 4500, a substrate can be transferred from a coating module to a transfer module. At 4600, a substrate can be transferred from a transfer module to a curing module. A curing module can be configured to treat the coated organic material at 4700, such as to provide a uniform organic film layer. For example, the curing module can be configured to provide optical treatment, such as an ultraviolet light treatment, to a coated organic material formulation layer to polymerize or otherwise cure an organic material coated on a deposition region of a substrate to form an organic film layer.

Various embodiments of coating systems can have additional apparatuses and subassemblies for providing additional features to various coating systems of the present teachings. As previously discussed herein, regarding motion systems supporting various carriage assemblies of the present teachings, coating apparatus 2000 of FIG. 2A can have a first X-axis carriage that can be used for mounting a coating assembly and a second carriage assembly that can be used to mount a variety of various assemblies, such as an inspection assembly that can include a camera assembly. For example, a substrate inspection assembly including a camera assembly can be mounted on a Z-axis moving plate of a X-axis carriage, to provide precision X,Z positioning of an inspection assembly with respect to a substrate positioned on a substrate support, such as floatation table 2220 of FIG. 2B. A camera assembly can be any image sensor device that converts an optical image into an electronic signal, such as by way of non-limiting example, a charge-coupled device (CCD), a complementary metal-oxide-semiconductor (CMOS) device or N-type metal-oxide-semiconductor (NMOS) device. Various image sensor devices can be configured as an array of sensors for an area scan camera, or a single row of sensors, for a line scan camera. A camera assembly can be connected to image processing system that can include, for example, a computer for storing, processing, and providing results Moreover, precision XYZ motion of a camera relative to a substrate can be done for either area scanning or line scanning processes. As previously discussed herein, other motion systems, such as a gantry motion system, can also be used to provide precision movement in three dimensions between, for example, a coating assembly and/or a camera assembly, relative to a substrate. Additionally, lighting can be mounted in various positions; either on an X-axis motion system or on a substrate support apparatus proximal to a substrate, and combinations thereof. In that regard, lighting can be positioned according to performing various lightfield and darkfield analyses, and combinations thereof. Various embodiments of a motion system can position a camera assembly relative to a substrate using a continuous or a stepped motion or a combination thereof to capture a series of one or more images of the surface of a substrate. For example, with respect to verifying particle control, during the coating of an encapsulation layer on an active area of a various OLED-based devices and apparatuses, images of particles can be obtained using image processing, and size and number of particles of a specific size can be determined. In various embodiments of systems and methods of the present teachings, a line scan camera having about 8192 pixels, with a working height of about 190 mm, and capable of scanning at about 34 kHz can be used.

Additionally, more than one camera can be mounted on an X-axis carriage assembly for various embodiments of a coating system substrate camera assembly, where each camera can have different specifications regarding field of view and resolution. For example, one camera can be a line scan camera for in situ particle inspection, while a second camera can be for regular navigation of a substrate in an enclosed coating system. Such a camera useful for regular navigation can be an area scan camera having a field of view in the range of about 5.4 mm×4 mm with a magnification of about 0.9× to about 10.6 mm×8 mm with a magnification of about 0.45×. In still other embodiments, one camera can be a line scan camera for in situ particle inspection, while a second camera can be for precise navigation of a substrate in an enclosed coating system, for example, for substrate alignment. Such a camera can be useful for precise navigation can be an area scan camera having a field of view of about 0.7 mm×0.5 mm with a magnification of about 7.2×.

Figure 5:
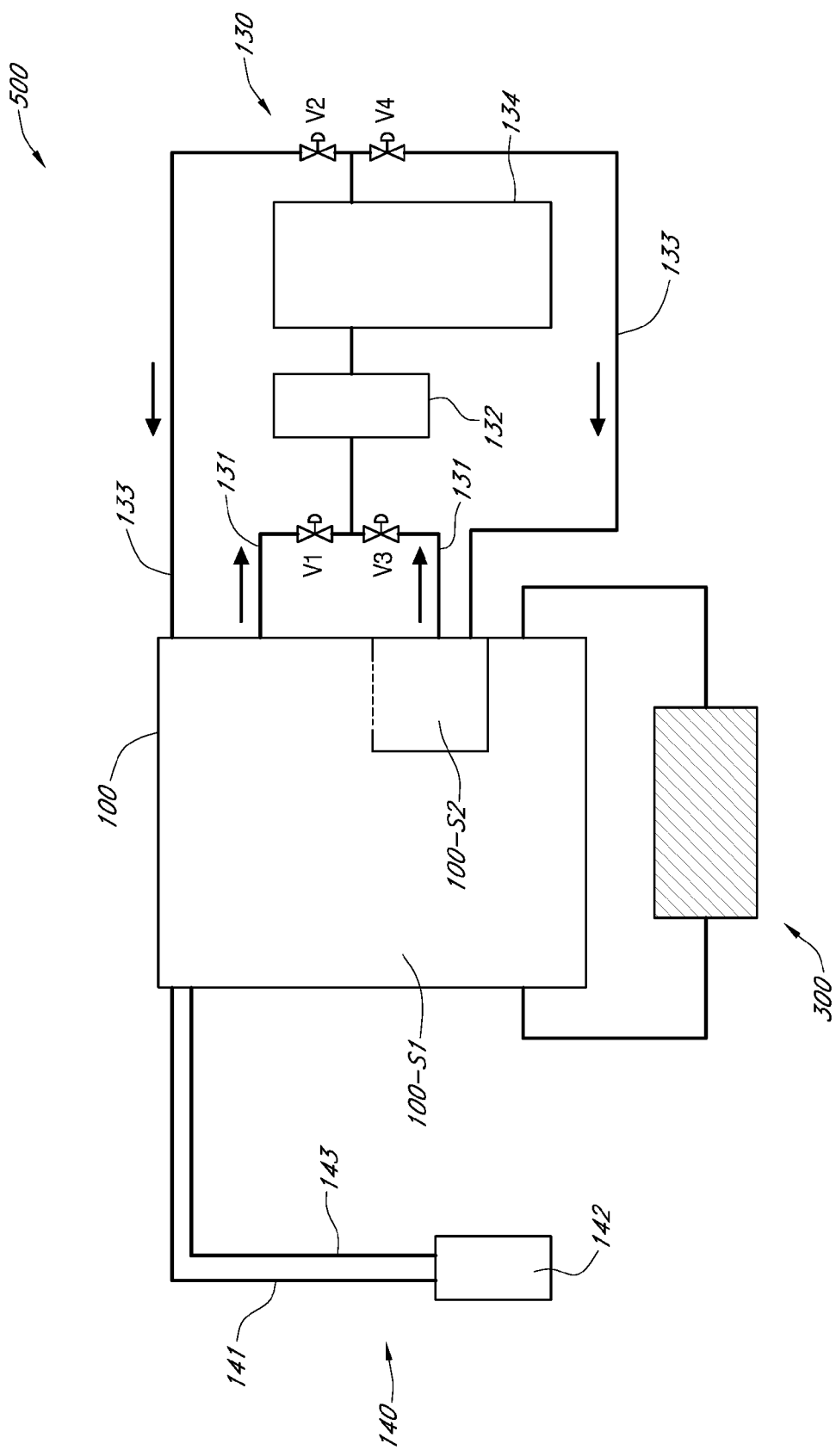
FIG. 5 is a schematic view of various embodiments of an enclosed coating system and related system components the present teachings.

FIG. 5 is a schematic diagram showing enclosed coating system 500. Various embodiments of enclosed coating system 500 according to the present teachings can comprise enclosure assembly 100 for housing a coating system, gas purification loop 130 in fluid communication enclosure assembly 100, and at least one thermal regulation system 140. Additionally, various embodiments of enclosed coating system 500 can have pressurized inert gas recirculation system 300, which can supply inert gas for operating various devices, such as a substrate floatation table for an enclosed coating system. Various embodiments of a pressurized inert gas recirculation system 300 can utilize a compressor, a blower and combinations of the two as sources for various embodiments of pressurized inert gas recirculation system 300. Additionally, enclosed coating system 500 can have a circulation and filtration system internal to enclosed coating system 500 (not shown).

Enclosed coating system 500 of FIG. 5 can have a first enclosure with a first enclosure volume and a second enclosure with a second enclosure volume, such as shown, for example in FIG. 1. For enclosed coating system 500, if all valves, $V_1$, $V_2$, $V_3$ and $V_4$ are opened, then gas purification loop 130 operates to purify both first enclosure volume 100-S1 and second enclosure volume 100-S2. With closure of $V_3$ and $V_4$, only first enclosure volume 100-S1 is in fluid communication with gas purification loop 130. This valve state may be used, for example, but not limited by, when second enclosure volume 100-S2 is sealably closed and isolated from first enclosure volume 100-S1 during a maintenance procedure requiring that second enclosure volume 100-S2 be opened to the atmosphere. With closure of $V_1$ and $V_2$, only second enclosure volume 100-S2 is in fluid communication with gas purification loop 130. This valve state may be used, for example, but not limited by, during recovery of second enclosure volume 100-S2 after the second enclosure has been opened to the atmosphere. As the requirements for gas purification loop 130 are specified with respect to the total volume of enclosed coating system 500, by devoting the resources of a gas purification system to the recovery of a second enclosure volume 100-S2, which is substantially less than the volume of first enclosure volume 100-S1, the recovery time or enclosed coating system 500 can be substantially reduced.

As depicted in FIG. 5, for various embodiments of an enclosed coating system according to the present teachings, the design of a circulation and filtration system can separate the inert gas circulated through gas purification loop 130 from the inert gas that is continuously filtered and circulated internally for various embodiments of an enclosed coating system. Gas purification loop 130 includes outlet line 131 from enclosure assembly 100, to a solvent removal system 132 and then to gas purification system 134. Inert gas purified of solvent and other reactive gas species, such as oxygen, ozone, and water vapor, are then returned to enclosure assembly 100 through inlet line 133. Gas purification loop 130 may also include appropriate conduits and connections, and sensors, for example, oxygen, ozone, water vapor and solvent vapor sensors. A gas circulating unit, such as a fan, blower or motor and the like, can be separately provided or integrated, for example, in gas purification system 134, to circulate gas through gas purification loop 130. According to various embodiments of an enclosed coating system, though solvent removal system 132 and gas purification system 134 are shown as separate units in the schematic shown in FIG. 5, solvent removal system 132 and gas purification system 134 can be housed together as a single purification unit.

Gas purification loop 130 of FIG. 5 can have solvent removal system 132 placed upstream of gas purification system 134, so that inert gas circulated from enclosure assembly 100 passes through solvent removal system 132 via outlet line 131. According to various embodiments, solvent removal system 132 may be a solvent trapping system based on adsorbing solvent vapor from an inert gas passing through solvent removal system 132 of FIG. 5. A bed or beds of a sorbent, for example, but not limited by, such as activated charcoal, molecular sieves, and the like, may effectively remove a wide variety of organic solvent vapors. For various embodiments of an enclosed coating system cold trap technology may be employed to remove solvent vapors in solvent removal system 132. As previously discussed herein, for various embodiments of an enclosed coating system according to the present teachings, sensors, such as oxygen, ozone, water vapor and solvent vapor sensors, may be used to monitor the effective removal of such species from inert gas continuously circulating through an enclosed coating system, such as enclosed coating system

500 of FIG. 5. Various embodiments of a solvent removal system can indicate when sorbent, such as activated carbon, molecular sieves, and the like, has reached capacity, so that the bed or beds of sorbent can be regenerated or replaced. Regeneration of a molecular sieve can involve heating the molecular sieve, contacting the molecular sieve with a forming gas, a combination thereof, and the like. Molecular sieves configured to trap various species, including oxygen, ozone, water vapor, and solvents, can be regenerated by heating and exposure to a forming gas that comprises hydrogen, for example, a forming gas comprising about 96% nitrogen and 4% hydrogen, with said percentages being by volume or by weight. Physical regeneration of activated charcoal can be done using a similar procedure of heating under an inert environment.

Any suitable gas purification system can be used for gas purification system 134 of gas purification loop 130 of FIG. 5. Gas purification systems available, for example, from MBRAUN Inc., of Statham, N.H., or Innovative Technology of Amesbury, Mass., may be useful for integration into various embodiments of an enclosed coating system according to the present teachings. Gas purification system 134 can be used to purify one or more inert gases in enclosed coating system 500, for example, to purify the entire gas atmosphere within an enclosed coating system. As previously discussed herein, in order to circulate gas through gas purification loop 130, gas purification system 134 can have a gas circulating unit, such as a fan, blower or motor, and the like. In that regard, a gas purification system can be selected depending on the volume of the enclosure, which can define a volumetric flow rate for moving an inert gas through a gas purification system. For various embodiments of an enclosed coating system with a volume of up to about 4 m$^3$; a gas purification system that can move about 84 m$^3$/h can be used. For various embodiments of an enclosed coating system with a volume of up to about 10 m$^3$; a gas purification system that can move about 155 m$^3$/h can be used. For various embodiments of an enclosed coating system having a volume of between about 52-114 m$^3$, more than one gas purification system may be used.

Any suitable gas filters or purifying devices can be included in the gas purification system 134 of the present teachings. In some embodiments, a gas purification system can comprise two parallel purifying devices, such that one of the devices can be taken off line for maintenance and the other device can be used to continue system operation without interruption. In some embodiments, for example, the gas purification system can comprise one or more molecular sieves. In some embodiments, the gas purification system can comprise at least a first molecular sieve, and a second molecular sieve, such that, when one of the molecular sieves becomes saturated with impurities, or otherwise is deemed not to be operating efficiently enough, the system can switch to the other molecular sieve while regenerating the saturated or non-efficient molecular sieve. A control unit can be provided for determining the operational efficiency of each molecular sieve, for switching between operation of different molecular sieves, for regenerating one or more molecular sieves, or for a combination thereof. As previously discussed herein, molecular sieves may be regenerated and reused.

Thermal regulation system 140 of FIG. 5 can include at least one chiller 142, which can have fluid outlet line 141 for circulating a coolant into an enclosed coating system, and fluid inlet line 143 for returning the coolant to the chiller. An at least one fluid chiller 142 can be provided for cooling the gas atmosphere within enclosed coating system 500. For various embodiments of an enclosed coating system of the present teachings, fluid chiller 142 delivers cooled fluid to heat exchangers within the enclosure, where inert gas is passed over a filtration system internal the enclosure. At least one fluid chiller can also be provided with enclosed coating system 500 to cool heat evolving from an apparatus enclosed within enclosed coating system 500. For example, but not limited by, at least one fluid chiller can also be provided for enclosed coating system 500 to cool heat evolving from an enclosed coating system. Thermal regulation system 140 can comprise heat-exchange or Peltier devices and can have various cooling capacities. For example, for various embodiments of an enclosed coating system, a chiller can provide a cooling capacity of from between about 2 kW to about 20 kW. Various embodiments of an enclosed coating system can have a plurality of fluid chillers that can chill one or more fluids. In some embodiments, the fluid chillers can utilize a number of fluids as coolant, for example, but not limited by, water, anti-freeze, a refrigerant, and a combination thereof as a heat exchange fluid. Appropriate leak-free, locking connections can be used in connecting the associated conduits and system components.

While embodiments of the present disclosure have been shown and described herein, it will be obvious to those skilled in the art that such embodiments are provided by way of example only. Embodiments of an enclosed coating system according to the present teachings can be useful for patterned area coating of substrates in the manufacture of a variety of apparatuses and devices in a wide range of technology areas, for example, but not limited by, OLED displays, OLED lighting, organic photovoltaics, Perovskite solar cells, and organic semiconductor circuits. Numerous variations, changes, and substitutions will now occur to those skilled in the art without departing from the disclosure. It is intended that the following claims define the scope of the disclosure and that methods and structures within the scope of these claims and their equivalents be covered thereby.

What is claimed is:

1. A method for providing a coating on a substrate, comprising:
   transferring the substrate to a slot die coating apparatus housed in an enclosure;
   depositing an organic material in a pattern over a deposition region using the enclosed slot die coating apparatus, the deposition region being over at least a portion of an electronic device fabricated upon a substrate;
   transferring the substrate with the organic material deposited thereon to an enclosed curing module;
   supporting the substrate in the enclosed curing module using a pressurized gas cushion distributed between the substrate and a substrate support apparatus, the pressurized gas cushion being sufficient to float the substrate above the substrate support apparatus; and
   performing an optical treatment on the organic material deposited on the substrate in the enclosed curing module to form an organic film layer in the pattern over the deposition region.

2. The method of claim 1, wherein,
   the substrate support apparatus comprises a porous material; and
   the pressurized gas cushion is established by forcing gas through the porous material.

3. The method of claim 1, wherein the pressurized gas cushion is established using pressurized gas.

4. The method of claim 1, the pressurized gas cushion is established using a combination of a pressurized gas region and at least a partial vacuum region.

5. The method of claim 1, further comprising maintaining a controlled processing environment at or near atmospheric conditions within the enclosure housing the slot die coating apparatus.

6. The method of claim 5, further comprising maintaining the controlled processing environment at or below a specified particulate contamination level.

7. The method of claim 5, wherein the particulate contamination level is maintained at 100 ppm or less.

8. The method of claim 1, further comprising maintaining an inert gas environment within the enclosure housing the slot die coating apparatus.

9. The method of claim 1, wherein the inert gas environment comprises an inert gas selected from nitrogen, any noble gas, and combinations thereof.

10. The method of claim 1, wherein performing the optical treatment on the organic material comprises applying ultraviolet light to cure the organic material.

11. The method of claim 1, further comprising sensing a position of the slot die coating assembly relative to the substrate during the depositing of the organic material.

12. The method of claim 1, wherein the electronic device fabricated on the substrate comprises an organic-light emitting diode.

* * * * *